(12) United States Patent
Daniels

(10) Patent No.: US 8,129,730 B2
(45) Date of Patent: Mar. 6, 2012

(54) SOLID STATE LIGHT SHEET AND BARE DIE SEMICONDUCTOR CIRCUITS WITH SERIES CONNECTED BARE DIE CIRCUIT ELEMENTS

(75) Inventor: John J. Daniels, Madison, CT (US)

(73) Assignee: Lumachip, Inc., Waterford, CT (US)

( * ) Notice: Subject to any disclaimer, the term of this patent is extended or adjusted under 35 U.S.C. 154(b) by 0 days.

(21) Appl. No.: 12/412,414

(22) Filed: Mar. 27, 2009

(65) Prior Publication Data

US 2009/0261357 A1  Oct. 22, 2009

Related U.S. Application Data

(62) Division of application No. 11/454,479, filed on Jun. 16, 2006, now Pat. No. 7,858,994.

(51) Int. Cl.
*H01L 33/00* (2010.01)

(52) U.S. Cl. ............... 257/88; 257/80; 257/75; 257/89; 257/99; 257/103; 257/443; 257/100; 257/E33.046; 257/E33.064; 257/E33.066; 257/E33.001; 257/E33

(58) Field of Classification Search .................. 257/93, 257/98, 99, 88, 75, 80, 103, 443, 100, E33.046, 257/E33.064, E33.066, E33.001, E33
See application file for complete search history.

(56) References Cited

U.S. PATENT DOCUMENTS

| | | |
|---|---|---|
| 2002/0191220 A1 | 12/2002 | Czyszczewski et al. |
| 2005/0233504 A1* | 10/2005 | Doi et al. .................... 438/127 |
| 2008/0191220 A1* | 8/2008 | Daniels et al. ................. 257/88 |
| 2009/0261357 A1* | 10/2009 | Daniels ......................... 257/88 |

* cited by examiner

*Primary Examiner* — Marc Armand
(74) *Attorney, Agent, or Firm* — Adams & Wilks

(57) ABSTRACT

An electronically active sheet includes a bottom substrate having a bottom electrically conductive surface. A top substrate having a top electrically conductive surface is disposed facing the bottom electrically conductive surface. An electrical insulator separates the bottom electrically conductive surface from the top electrically conductive surface. At least one bare die electronic element is provided having a top conductive side and a bottom conductive side. Each bare die electronic element is disposed so that the top conductive side is in electrical communication with the top electrically conductive surface and so that the bottom conductive side is in electrical communication with the bottom electrically conductive surface.

8 Claims, 30 Drawing Sheets

Single layer RGGB variable color light sheet for backlighting displays
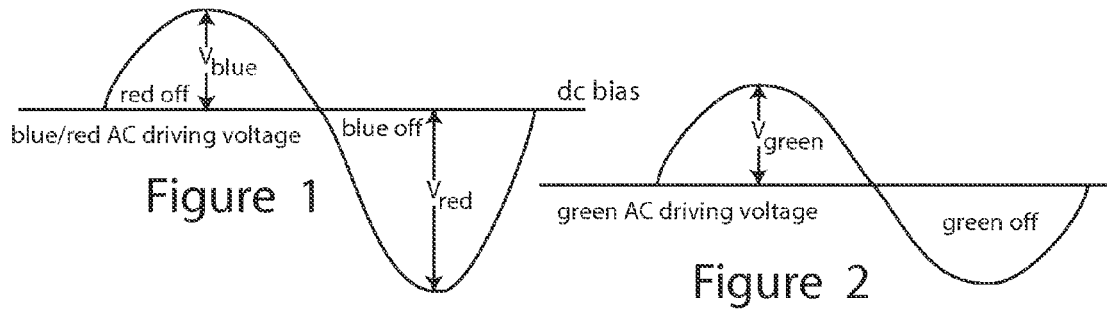
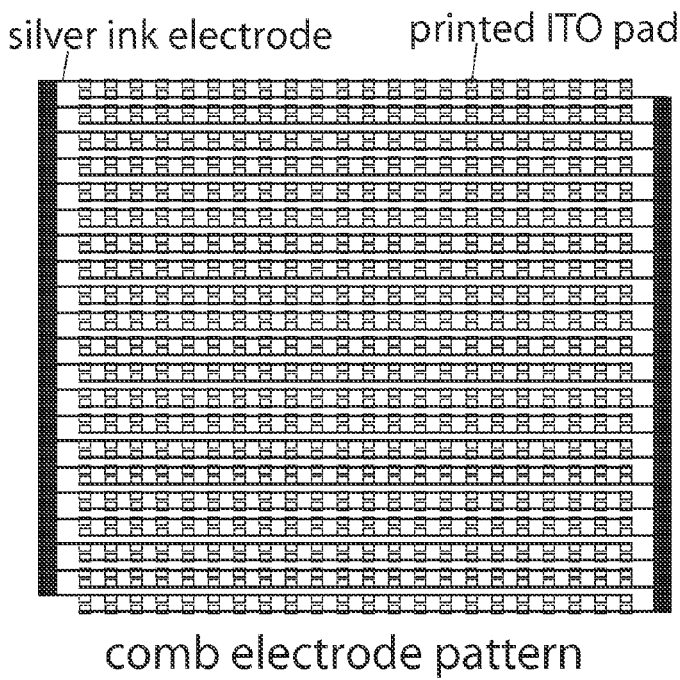
Figure 3
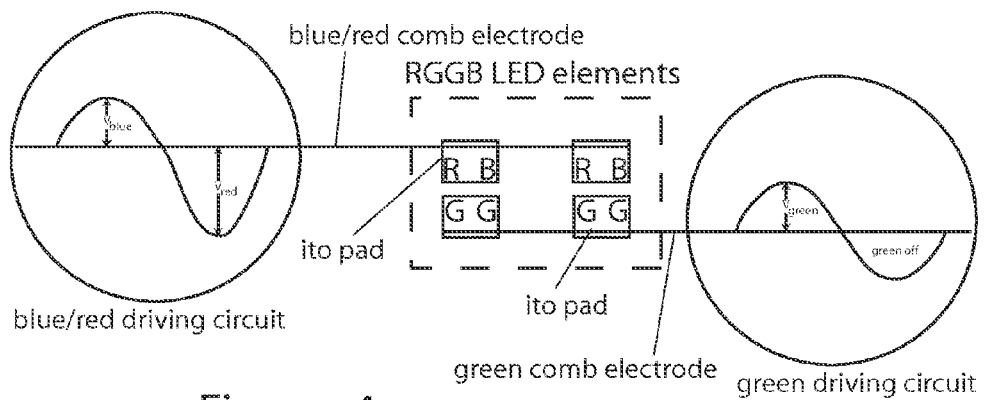
Figure 4 back substrate printed silver ink front substrate printed silver ink front substrate printed ITO front substrate insulator front substrate printed text as assembled x-y grid electrodes for notebook
computer backlight x grid electrodes for notebook
computer backlight y grid electrodes for notebook
computer backlight

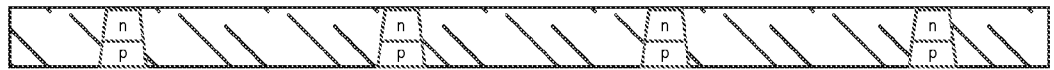
Figure 21
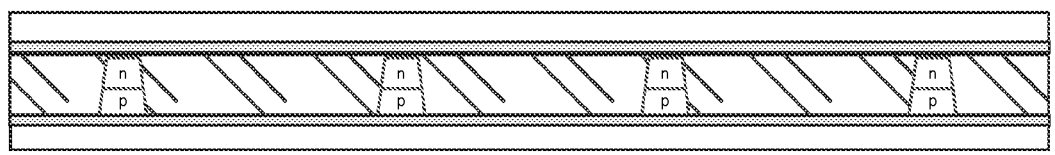
Figure 22
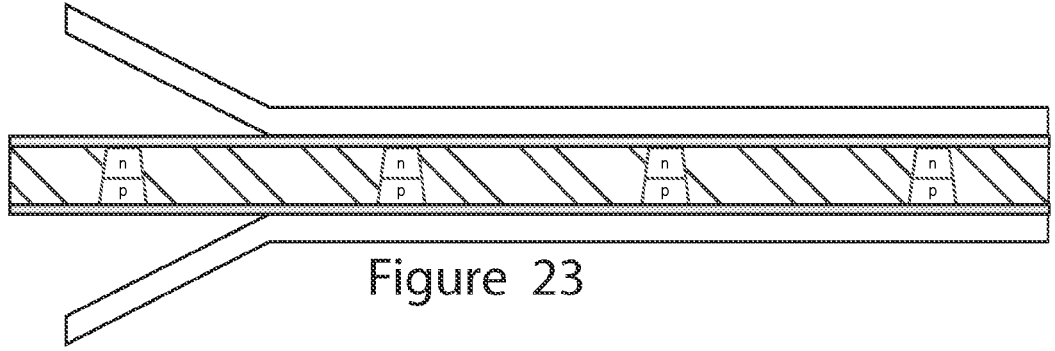
Figure 23
Figure 24

Accomodating different chip heights
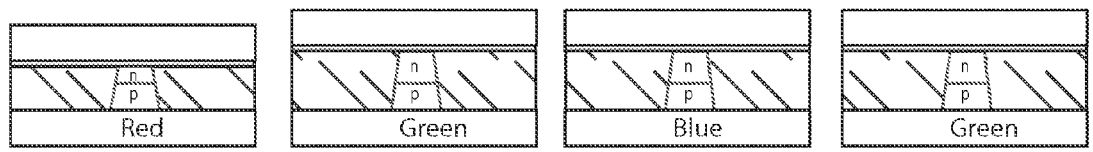
Figure 34   Separate strips of Red, Green and Blue
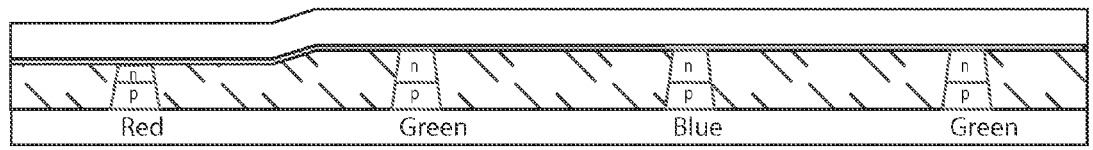
Figure 35   Same bottom substrate, different adhesive thickness
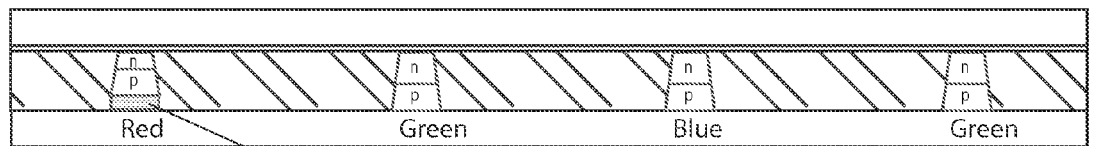
Figure 36
Thickness increasing material
(solder bump, conductive adhesive, additional semiconductor substrate, etc)

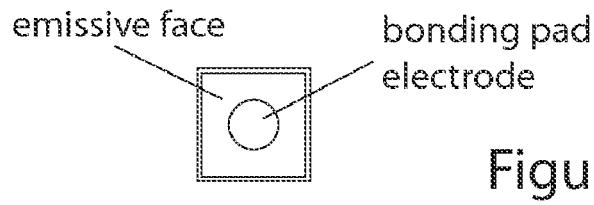

emissive face — bonding pad electrode

Figure 44 prior art

Top down view of conventional LED chip

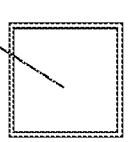

emissive face

Figure 45

Top down view of inventive LED chip

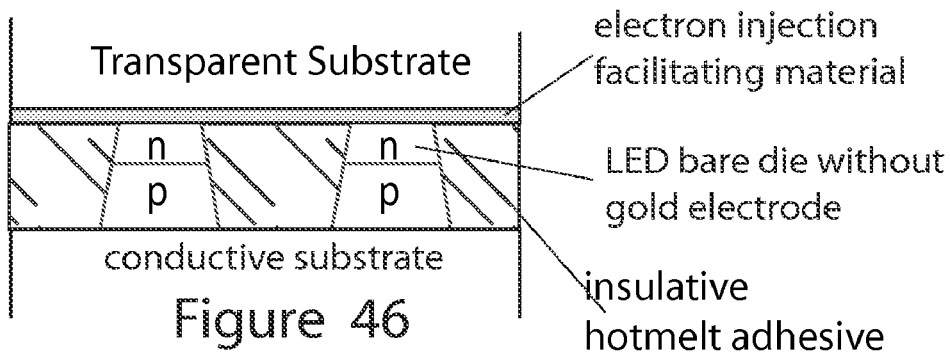

Transparent Substrate — electron injection facilitating material

LED bare die without gold electrode conductive substrate insulative hotmelt adhesive

Figure 46

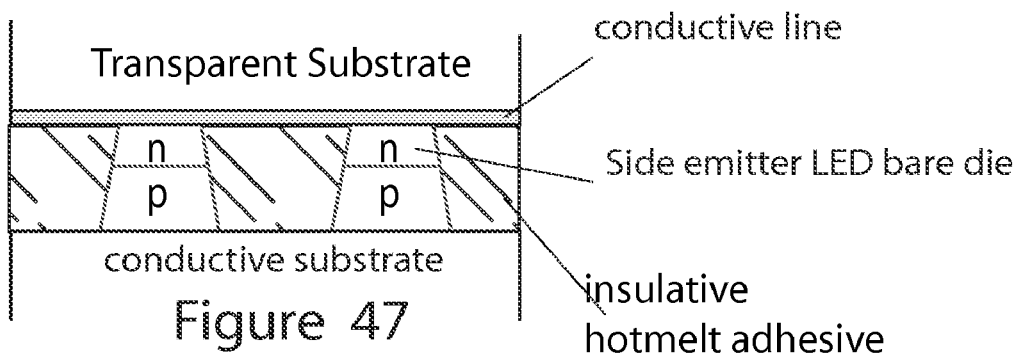

Transparent Substrate — conductive line

Side emitter LED bare die conductive substrate insulative hotmelt adhesive

Figure 47

12 Volt Device Structure

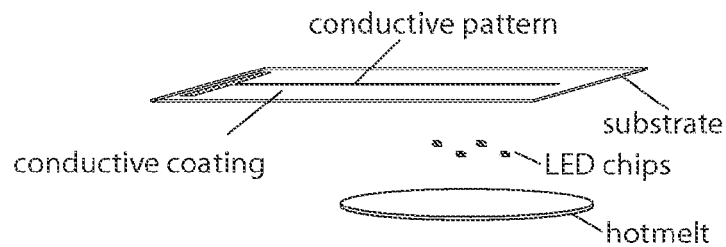
Figure 64
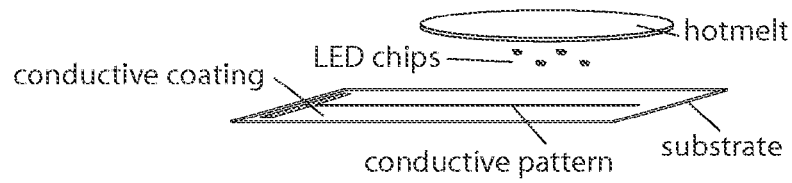
Figure 65

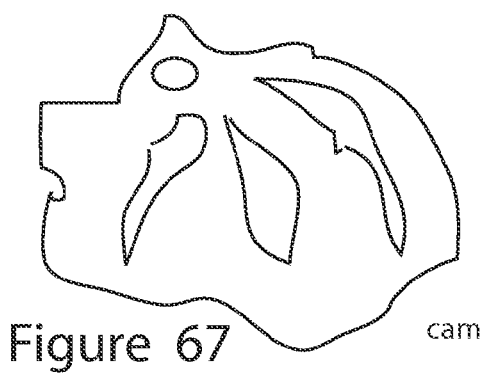
Figure 67  camoflaged housing
can be translucent, opaque, include light guides, etc

SOLID STATE LIGHT SHEET AND BARE DIE SEMICONDUCTOR CIRCUITS WITH SERIES CONNECTED BARE DIE CIRCUIT ELEMENTS

CROSS-REFERENCE TO RELATED APPLICATIONS

This application is a divisional of U.S. patent application Ser. No. 11/454,479 filed Jun. 16, 2006.

BACKGROUND OF THE INVENTION

The present invention pertains to a semiconductor roll-to-roll and batch manufacturing methods. The present invention also pertains to a light emitting diode light sheet and methods for manufacturing the same. More particularly, the present invention pertains to an inorganic light emitting diode light sheet that can be used as a photo-radiation source for applications including, but not limited to, general illumination, architectural lighting, novelty lighting, display backlighting, heads-up displays, commercial and roadway signage, monochromatic and full-color static and video displays, a radiation-source for photo-curable materials, patterned light emissive images, scrolling displays, friend or foe identification, and the like. Further, the present invention pertains more particularly to an inorganic light active sheet that can be used as a light-to-energy device for converting photo-radiation to electrical energy for applications including, but not limited to, solar panels, CCD-type cameras, photo-sensors, and the like. Further, the present invention pertains more particularly, to methods for mass-producing the inventive light active sheet at relatively low cost.

Inorganic light emitting diodes (LED) are based on elements of the periodic table of a vast variety. They come out of semiconductor technology, and indeed, a semiconductor diode such as a silicon diode, or a germanium diode were among the first semiconductor devices. These were made by doping the silicon or the germanium with a small amount of impurity to make n-type (excess electrons) or p-type (excess holes) in the material. LEDs emit light because of the materials selected so that the light is emitted in the ultra-violet, visible, or infrared ranges of the spectrum. The types of materials used are made from vapor deposition of materials on semiconductor wafers and cut into dice (a single one is a die). Typically, the die, or LED dice, are about 12 mil sq. The composition of the dice depends on the color, for example some red dice are AlInGaAs and some blue dice are InGaN. The variations are typically "three-five" variations, so-called because they vary based on the third and fifth period of the periodic table to provide the n- and p-type materials.

The conversion of an LED die into an LED lamp is a costly process, involving very precise handling and placement of the tiny LED die. The LED dice are most simply prepared as 3 mm LED lamps. The die is robotically placed in a split cup with electrodes on each side. The entire structure is encased in a plastic lens that attempts to focus the beam more narrowly. High brightness dice may also be surface mounted with current-driving and voltage limiting circuits, and elaborate heat sink and heat removal schemes. Connection is by soldering or solderless ultrasonic wire bond methods. The result is a discrete point source of light. The LED lamp has a pair of leads, which can then be soldered to a printed circuit board. The cost of forming the lamp and then soldering the lamp to a printed circuit board is a relatively expensive process. Accordingly, there is a need to reduce the cost of forming a light emitting device based on the LED die.

As an example application of LED lamps, it has recently been shown that ultraviolet LED lamps can be used to cure photo-polymerizable organic materials (see, for example, Loctite® 7700 Hand Held LED Light Source, Henkel-Loctite Corporation, Rocky Hill, Conn.).

Photo-polymerizable organic materials are well known and are used for applications such as adhesives, binders and product manufacturing. Photo-polymerization occurs in monomer and polymer materials by the cross-linking of polymeric material. Typically, these materials are polymerized using radiation emitted from sources of light including intensity flood systems, high intensity wands, chambers, conveyors and unshielded light sources.

As an example use of photo-polymerizable organic materials, precision optical bonding and mounting of glass, plastics and fiber optics can be obtained with photo-polymerizable adhesives. These materials can be used for opto-mechanical assembly, fiber optic bonding and splicing, lens bonding and the attachment of ceramic, glass, quartz, metal and plastic components.

Among the drawbacks of the conventional systems that utilize photo-polymerizable organic materials is the requirement of a high intensity photo-radiation source. Typically, light sources, such as mercury vapor lamps, have been used to generate the radiation needed for photo-polymerization. However, these light sources are an inefficient radiation source because most of the energy put in to drive the lamp is wasted as heat. This heat must be removed from the system, increasing the overall bulk and cost. Also, the lamps have relatively short service life-times, typically around 1000 hours, and are very costly to replace. The light that is output from these light sources usually covers a much broader spectrum than the photo-radiation wavelengths that are needed for photo-polymerization. Much of the light output is wasted. Also, although the material can be formulated to be hardened at other wavelengths, the typical photo-polymerizable organic material is hardened at one of the peak output wavelengths of the mercury vapor lamp, to increase the polymerization efficiency. This peak output wavelength is in the UV region of the radiation spectrum. This UV radiation is harmful to humans, and additional shielding and protective precautions such as UV-filtering goggles are needed to protect the operators of such equipment.

FIG. 66 is a side view of an inorganic LED die available. A conventional inorganic LED die is available from many manufacturers, typically has a relatively narrow radiation emission spectrum, is relatively energy efficient, has a long service life and is solid-state and durable. The die shown is an example of an AlGaAs/AlGaAs red die, obtained from Tyntek Corporation, Taiwan. These dice have dimensions roughly 12 mil×12 mil×8 mil, making them very small point light sources. As shown in FIG. 67, in a conventional LED lamp, this die is held in a metal cup so that one electrode of the die (e.g., the anode) is in contact with the base of the cup. The metal cup is part of an anode lead. The other electrode of the die (e.g., the cathode) has a very thin wire soldered or wire bonded to it, with the other end of the wire soldered or wire bonded to an anode lead. The cup, die, wire and portions of the anode and cathode leads are encased in a plastic lens with the anode and cathode leads protruding from the lens base. These leads are typically solder or wire bonded to a circuit board to selectively provide power to the die and cause it to emit light. It is very difficult to manufacture these conventional lamps due to the very small size of the die, and the need to solder or wire bond such a small wire to such a small die electrode. Further, the plastic lens material is a poor heat conductor and the cup provides little heat sink capacity. As the die heats up its efficiency is reduced, limiting the service conditions, power efficiency and light output potential of the lamp. The bulkiness of the plastic lens material and the need to solder or wire bond the lamp leads to an electrical power source limits emissive source packing density and the potential output intensity per surface area.

There is a need for a photo-radiation source that is energy efficient, generates less heat, is low cost and that has a narrow, broad and/or variable spectrum of radiation emission wavelength and intensity. A typical LED consists of a sub-millimeter sized die of light emitting material that is electrically connected to an anode lead and a cathode lead. The die is encased within a plastic lens material. However, the processing that takes the LED dice and turns it into an LED lamp is tedious and sophisticated, mostly due to the very small size of the LED die. It is very difficult to solder or wire bond directly to the dice, and so it is common practice to use LED lamps that are then solder or wire bonded onto a circuit board. Conventionally, LED lamps have been solder or wire bonded onto a circuit board in a formation to create a source of photo-radiation for photo-polymerizable organic materials.

This solution is far from optimum, since the relatively high cost of the LED lamps keeps the overall cost of the photo-radiation source high. There is a need for a photo-radiation source that can use the LED dice directly, without the need for the lamp construction or a direct solder or wire bonded connection between the anode and cathode of the die. Such as system would have an efficient die packing density, enabling a high-intensity photo-radiation source having a narrow emission band.

Wantanabe et al., published patent application US2004/0195576A1, teaches a device and method for forming a transparent electrode over the light-emitting portion of an LED die. This reference is concerned with overcoming the difficulty of forming an electrode accurately at the light output surface of a minute LED device (10 square microns). A conventional LED is 300 square microns. The reference states that forming a transparent electrode on a semiconductor device so as not to shield emitted light is already known. The crux of the Wantanabe invention is to form a transparent electrode directly and specifically over the light output face of a tiny LED device, or an array of such devices, instead of the conventional bonding or soldering of an opaque wire to connect the LED device to a power supply line or lead. To form the transparent electrode on such a small device, this reference teaches the use of semiconductor and/or printed circuit board techniques.

An example of the steps of forming the Wantanabe device consist of:

1) Providing a substrate
2) Forming p-side wiring on the substrate
3) Transferring a light emitting diode onto the substrate so the p side of the diode is connected to the wiring
4) Forming an insulation resin layer to cover the substrate, wiring and diode
5) Selectively removing the insulation resin to expose the n-side surfaces of the diode
6) Forming n-side wiring on the surface of the insulation resin
7) Forming a transparent electrode connecting the n-side of the diode to the n-side wiring The steps for forming the transparent electrode are:

7a) Forming a resist film to cover the insulation resin and the exposed n-side surfaces
7b) Selectively removing the resist layer to form an opening portion defining the light output surface of the diode and the n-side wiring
7c) Applying an electrode paste to the opening portion and the resist film
7d) Removing the electrode paste from the resist film to leave electrode paste only where the opening portion is so that the light output surface of the diode and the n-side wiring are connected.

There are variations disclosed to the various steps and materials used, but in essence, the same cumbersome PCB-type processes are described in each of the examples. This reference shows that it is known to form a transparent electrode using PCB techniques on the light output surface of a diode to reduce the shielding of light emitted from the diode. But, replacing the conventionally-used opaque wire with a transparent electrode film is not new and is in the public domain (see, Lawrence et al, U.S. Pat. No. 4,495,514).

Oberman, U.S. Pat. No. 5,925,897, teaches using a diode powder between conductive contacts, forming a conductor/emissive layer/conductor device structure. The diode powder consists of crystal particles 10-100 microns in size. The diode powder is formed by heating a mixture of In and Ga in a crucible and flowing nitrogen gas over the heated mixture. This powder now contains all n-type material. The powder is adhered to a glass plate that is coated with an appropriate contact metal. A p-type dopant is diffused into the powder crystals to form a p-region and the p-n diode junction. A top substrate with a transparent conductive surface is placed on the powder and the entire structure thermally annealed to enhance the adhesion of the powder to the upper contact. Oberman states that the conventional LED is typically fabricated by connecting electrical contacts to the p and n regions of individual dies, and enclosing the entire LED die in a plastic package. Oberman's diode powder is specifically based on an observation that surfaces, interfaces and dislocations appear to not adversely affect the light emitting properties of III-V nitrides. This reference says that the state-of-the-art nitride LED is grown on a sapphire substrate, and since sapphire is non-conducting, both electrical contacts are made from the top of the structure.

Wickenden et al., U.S. Pat. No. 4,335,501, teaches a method for manufacturing a monolithic LED array. The individual LEDs are formed by cutting isolation channels through a slice of n-type material. The channels are cut in two steps, a first step is cutting a gap into the back of the slice of n-type material and then this gap is filled with glass. Then, in a second step the front of the slice is cut to complete the channel and the front cut is also filled with glass. Once the isolation channels have been formed, the tops of the remaining blocks of n-type material are doped to become p-type and the n-p junction of each LED formed. Beam leads are formed connecting the p-regions of the LEDs.

Nath, et al., WO92/06144 and U.S. Pat. No. 5,273,608, teaches a method for laminating thin film photovoltaic devices with a protective sheet. The method provides the encapsulation of thin-film devices such as flexible solar cells within a top insulating substrate and a bottom insulating substrate. Nath's description of the relevant prior art shows that encapsulating thin film devices between insulating sheets is not new. This reference teaches that the use of a heated roller is undesirable. Nath's invention is to a specific method that heats a whole roll of composite material all at once to avoid the use of heated rollers. Nath teaches a new method for protecting and encapsulating thin film devices. Encapsulating thin film devices between insulating sheets is not new, but Nath teaches a specific method that avoids the use of heated rollers.

SUMMARY OF THE INVENTION

The present invention is intended to overcome the drawbacks of the prior art. It is an object of the present invention to provide methods for manufacturing solid-state light active devices. It is another object of the present invention to provide device structures for solid-state light active devices. It is yet another object of the present invention to provide a method of making a light sheet material. It is yet another object of the present invention to provide a method of manufacturing an encapsulated semiconductor circuit using a roll-to-roll fabrication process. It is yet another object of the present invention to provide a flat panel (eg LCD) display back light. It is yet another object of the present invention to provide a solid state general illumination source. It is yet another object of the present invention to provide a thin, flexible, durable, addressable display. It is yet another object of the present invention to provide a thin, flexible, durable, solid state bare die electronic circuit.

An electronically active sheet includes a bottom substrate having a bottom electrically conductive surface. A top substrate having a top electrically conductive surface is disposed facing the bottom electrically conductive surface. An electrical insulator separates the bottom electrically conductive surface from the top electrically conductive surface. At least one bare die electronic element is provided having a top conductive side and a bottom conductive side. Each bare die electronic element is disposed so that the top conductive side is in electrical communication with the top electrically conductive surface and so that the bottom conductive side is in electrical communication with the bottom electrically conductive surface.

The electrical insulator may comprise a hotmelt adhesive. Each bare die electronic element is embedded in the hot melt electrical insulator with the top conductive side and the bottom conductive side left uncovered by the electrical insulator. The electrical insulator binds the top substrate to the bottom substrate with the top conductive side of the bare die electronic element in electrical communication with the top electrically conductive pattern of the top substrate, and so that the bottom conductive side of the bare die electronic element is in electrical communication with the bottom conductive pattern of the bottom substrate. At least one electronic element may comprise a solid state semiconductor light emitting diode bare die.

The bare die electronic element can include a first conductor and a second conductor both disposed on either the top conductive side and the bottom conductive side, and wherein said bare die electronic element is disposed so that the first conductor and the second conductor are in electrical communication with respective wiring lines formed on either the top substrate and the bottom substrate.

The bare die electronic element may be plurality of individual bare die LED elements. The bottom electrically conductive surface and the top electrically conductive surface are formed as a respective x and y wiring grid for selectively addressing the individual bare die LED elements for forming a display.

A phosphor or other re-emitter can be provided in or on at least one of the top substrate and the bottom substrate (or adjacent thereto), or formed in the electrical insulator. The phosphor or other re-emitter is optically stimulated by a radiation emission of a first wavelength from the light active semiconductor element to emit light of a second wavelength. Alternatively, the phosphor can be disposed between the top and bottom conductive surfaces and electrically stimulated to emit light. In this construction electronic circuit elements, such as LED bare die, can be incorporated into a light sheet integrally formed with an electroluminescent (EL) phosphor light element.

In accordance with the present invention, a bare die semiconductor electronic circuit is provided comprising a first substrate having a bottom side surface having at least a first and a second conductive line. A second substrate is disposed adjacent to the first substrate. The second substrate has a top side surface having a third conductive line. A least one bare die semiconductor electronic circuit element having a first electrode and a second electrode disposed on an obverse side and a third electrode disposed on a reverse side is provided. An adhesive adheres the first substrate to the second substrate and binds the bare die semiconductor electronic circuit element to the first substrate and to the second substrate. The adhesive maintains the first electrode in electrical communication with the first conductive line, the second electrode in electrical communication with the second conductive line, and the third electrode is in electrical communication with the third conductive line. At least one of the first and the second substrate may be a flexible plastic sheet, such as PET, PEN, Kapton, polycarbonate, vinyl, and the like. At least one of the first, second and third wiring line can formed from a printed conductive ink, such as through silk screen, inkjet, gravure, donor sheet, electrostatic or other printing methods. Alternatively, the conductive lines can be formed by etching. The adhesive may be at least one of a hot melt and thermosetting adhesive. Alternatively, the adhesive may be at least one of a thermally active adhesive, a catalyst active adhesive, a solvent evaporation active adhesive and a radiation active adhesive.

In accordance with the present invention, a first substrate is provided having bottom side surface having at least a first and a second conductive line. A bare die semiconductor electronic circuit element is provided having a first electrode and a second electrode disposed on an obverse side. An adhesive encapsulates and adheres the bare die semiconductor electronic circuit element to the first substrate so that the first electrode is in electrical communication with the first conductive line and the second electrode is in electrical communication with the second conductive line. A second substrate can be disposed adjacent to the first substrate and bound to the first substrate by the adhesive.

The second substrate can include a top side surface having a third conductive line. The bare die semiconductor electronic circuit element includes a third electrode disposed on its reverse side. The adhesive encapsulates and adheres the bare die semiconductor electronic circuit element to the second substrate so that said third electrode is in electrical communication with the third conductive line.

An electrically conductive through-hole can be disposed in either the first substrate and/or the second substrate for electrically connecting the bare die semiconductor electronic circuit element to a conductive element disposed on a top side surface of the first substrate and/or on a bottom side surface of the second substrate.

A second bare die semiconductor electronic circuit element can be provided having at least one electrode. The adhesive encapsulates and adheres the second bare die semiconductor electronic circuit element to the first substrate so that the electrode of the second bare die semiconductor electronic circuit element is in electrical communication with at least one of the first electrode and the second electrode through the respective first and second conductive line.

In accordance with another aspect of the invention, an ultra-thin electronically active sheet is provided. At least one bare die electronic element is embedded in an electrical insulator. The bare die electronic element has at least a first conductive feature and a second conductive feature left uncovered by the electrical insulator. A first conductive structure disposed on the electrical insulator is electrically connected to the first conductive feature. A second conductive structure disposed on the electrical insulator and electrically connected with the second conductive feature.

An active and passive radiation emitting device for identifying personnel, locations or goods includes a first substrate having a first conductive surface. A pattern of active radiation emitting semiconductor elements are in electrical communication with the conductive surface so that when the conductive surface is energized the radiation emitting semiconductor elements emit radiation of at least a first wavelength. A second substrate is provided and an adhesive encapsulates and adheres the bare radiation emitting semiconductor elements to the first substrate and securing the second substrate to the first substrate. At least one of a passive radiation reflecting surface and an active thermal radiation source are fixed to at least one the first substrate and the second substrate. The passive radiation reflecting surface reflects radiation from an external radiation source and the active thermal radiation source provides a detectable thermal or far IR emission.

A light emitting device includes a first bottom substrate having an electrically conductive surface. A second bottom substrate having an electrically conductive surface is provided adjacent to but electrically isolated from the first bottom substrate. A first bare die light emitting diode device having a top p junction conductor and a bottom n junction conductor is provided in electrical communication with the electrically conductive surface of the first bottom conductor. A second bare die light emitting diode device having a top n junction conductor and a bottom p junction conductor is provided in electrical communication with the electrically conductive surface of the second bottom conductor. The p/n junctions of the diodes may be reversed. A top substrate has a conductive surface in electrical communication with both the top n junction conductor of the first bare die light emitting diode device and the top p junction conductor of the second bare die light emitting diode device. The electrically conductive surface of the top substrate is effective for putting the first bare die light emitting diode device and the second bare die light emitting diode device into a series electrical connection.

The electrically conductive surface can be provided with a predetermined resistance value effective to create the equivalent of a ballast resistor within a desired resistance range in series with the first bare die light emitting diode device and the second bare die light emitting diode device. This equivalent ballast resistor enables the bare die light emitting diode devices to be driven at a desired current level for a given voltage applied to the first and the second bottom substrates. The equivalent ballast resistor can be adjusted, through the selection of materials or geometry, so that the first and the second bare die light emitting diode devices can be connected in series even if they do not have the same electrical characteristics.

Subsequent bottom substrates and top substrates can be provided so that multiple series devices are connected. Depending on the chosen materials, geometry and LED bare die chips, an AC driven variable intensity, variable color 110V (or 220V) source lighting device can be provided. Other voltages and wavelength emissions are also possible using this inventive construction.

A light emitting device, comprising a first bottom substrate having an electrically conductive surface. A second bottom substrate is provided having an electrically conductive surface. A first bare die light emitting diode device having a top p junction conductor and a bottom n junction conductor is provided. The bottom n junction conductor is in electrical communication with the electrically conductive surface of the first bottom conductor. A second bare die light emitting diode device is provided having a top n junction conductor and a bottom p junction conductor. The bottom p junction conductor is in electrical communication with the electrically conductive surface of the second bottom conductor. A top substrate having a conductive surface is provided with the conductive surface in electrical communication with both the top p junction conductor of the first bare die light emitting diode device and the top n junction conductor of the second bare die light emitting diode device. The electrically conductive surface of the top substrate completes an electrical circuit with the first bare die light emitting diode device and the second bare die light emitting diode device in a series electrical connection. When a voltage of the correct polarity is applied to the first and the second bottom substrates, the light emitting diodes light up. When a voltage of opposite polarity is applied to the first and second bottom substrates, the series connected light emitting diode block electron flow. Other circuit elements can also be connected in parallel or series with the bare die light emitting diodes.

The electrically conductive surface of at least the first bottom substrate, the second bottom substrate and the top substrate has a predetermined resistance value effective to create a ballast resistor in series with the first bare die light emitting diode device and the second bare die light emitting diode device. In accordance with this aspect of the present invention, conventionally required discrete resistors are not needed. By selecting the proper materials, it is thus possible to create a light emitting device that can be connected to a predetermined voltage source, such as a 12 volt system of an automobile, truck or boat.

At least one subsequent bottom substrate can be provided having subsequent electrically conductive surface. Subsequent bare die light emitting diodes can be provided with opposite polarities in electrical communication with the subsequent electrically conductive surface. At least one subsequent top substrate having a subsequent top conductive surface in electrical communication with the subsequent bare die light emitting diodes is provided so that the subsequent bare die light emitting diodes are connected in series.

Opposite polarity bare die light emitting diode devices can be electrically connected in respective opposite polarity to and along with the first bare die light emitting diode device and the second bare die light emitting diode device to form a light emitting device that emits light when driven with an AC voltage.

An adhesive adheres the top substrate to the first bottom substrate and to the second bottom substrate. The adhesive also encapsulating the first bare die light emitting diode device and the second bare die light emitting diode device. The adhesive adheres the first bare die light emitting diode device to the first bottom substrate and to the top substrate while maintaining the electrical communication between the top p junction conductor of the first bare die light emitting diode device to the conductive surface of the first bottom substrate. The adhesive also maintains the electrical communication between the bottom n junction conductor of the first bare die light emitting diode device to the conductive surface of the top substrate. The adhesive adheres the second bare die light emitting diode device to the second bottom substrate and to the top substrate while maintaining the electrical communication between the bottom p junction conductor of the second bare die light emitting diode device to the conductive surface of the second bottom substrate. The adhesive also maintaining the electrical communication between the top n junction conductor of the second bare die light emitting diode device to the conductive surface of the top substrate. The adhesive may comprise at least one of a thermally active adhesive, a catalyst active adhesive, a solvent evaporation active adhesive and a radiation active adhesive.

The first and the second bare die light emitting diode devices are embedded in the adhesive with respective top conductive side and the bottom conductive side left at least partially uncovered by the adhesive. This allows the adhesive to bind the first bottom substrate and the second bottom substrate to the top substrate with the first and the second bare die light emitting diode devices in electrical communication with the respective conductive surfaces.

A bare die semiconductor circuit includes a first substrate having an electrically conductive surface. A second substrate is provided having an electrically conductive surface. A first bare die semiconductor circuit element has a first conductor and a second conductor. The second conductor of the first bare die semiconductor circuit element is in electrical communication with the electrically conductive surface of the first substrate. A second bare die semiconductor circuit element has a first conductor and a second conductor. The second conductor of the second bare die semiconductor circuit element is in electrical communication with the electrically conductive surface of the second substrate. A series connecting substrate has a conductive surface. The conductive surface of the series connecting substrate is in electrical communication with both the first conductor of the first bare die semiconductor circuit element and the first conductor of the second bare die semiconductor circuit element. The electrically conductive surface of the series connecting substrate is effective for putting the first bare die semiconductor circuit element and the second bare die semiconductor circuit element into a series electrical connection.

The present invention pertains to a solid state light emitting device having series connected bare die light emitting diode devices for forming a higher voltage light emitting device. A first substrate is provided having an electrically conductive surface. A second substrate also has an electrically conductive surface. A first bare die light emitting diode device is provided having a first junction of a first polarity and a second junction of a second polarity. The second junction of the first bare die light emitting diode device is in electrical communication with the electrically conductive surface of the first substrate. A second bare die light emitting diode device is provided having a first junction of the second polarity and a second junction of the first polarity. The second junction of the second bare die light emitting diode device is in electrical communication with the electrically conductive surface of the second substrate. A series connecting substrate is provided having a conductive surface. The conductive surface of the series connecting substrate is in electrical communication with both the first junction of the first bare die light emitting diode device and the first junction of the second bare die light emitting diode device. The electrically conductive surface of the series connecting substrate being effective for putting the first bare die light emitting diode device and the second bare die light emitting diode device into a series electrical connection.

BRIEF DESCRIPTION OF THE DRAWINGS

The patent or application file contains at least one drawing executed in color. Copies of this patent or patent application publication with color drawings will be provided by the Office upon request and payment of the necessary fee.

FIG. 1 is a graph illustrating an AC driving voltage applied to red and blue LED devices having opposite polarity in accordance with an embodiment of the inventive RGGB variable color light sheet;

FIG. 2 is a graph illustrating an AC driving voltage applied to green LED devices in accordance with an embodiment of the inventive RGGB variable color light sheet;

FIG. 3 shows a comb electrode pattern having printed silver ink electrodes and printed transparent conductor pads;

FIG. 4 illustrates the driving of two RGGB pixel elements in accordance with the embodiment of the inventive RGGB variable color light sheet;

FIG. 21 is a cross section unassembled view showing a top conductive surface on a top release sheet, a melt adhesive with embedded bare dies middle layer, and a bottom conductive surface on a bottom release sheet in accordance with an ultra-thin LED light sheet;

FIG. 22 is a cross section assembled after lamination view showing the top conductive surface on a top release sheet, the melt adhesive with embedded bare dies middle layer, and the bottom conductive surface on a bottom release sheet in accordance with the ultra-thin LED light sheet;

FIG. 23 is a cross section assembled view showing the peeling off of the top release sheet from the top conductive surface and the bottom release sheet from the bottom conductive surface in accordance with the ultra-thin LED light sheet;

FIG. 24 is a cross section showing the resulting ultra-thin LED light sheet;

FIG. 26 is a cross section showing a top emitting LED die electrically connected to the conductively patterned window of the embodiment of the inventive light sheet that does not require a transparent conductive window;

FIG. 27 illustrates individual RGBY light strips for an embodiment of the variable color and intensity light sheet;

FIG. 28 shows the light strips assembled for an RGBYG variable color and intensity light sheet;

FIG. 29 shows an alternative assembled RGBG variable color and intensity light sheet;

FIG. 30 illustrates the pattern of the alternative assembled RGBG variable color and intensity light sheet shown in FIG. 29;

FIG. 31 illustrates the G (green emitting LED die) pattern;

FIG. 32 illustrates the B (blue emitting LED die) pattern;

FIG. 33 illustrates the R (red emitting LED die) pattern;

FIG. 34 shows the cross sections of the individual color strips of RGBG light strips showing the differences in bare die height;

FIG. 35 illustrates the use of different adhesive thicknesses to accommodate the difference in bare die height;

FIG. 36 illustrates the use of a thickness increasing material to accommodate the difference in bare die height;

FIG. 44 is a top down view of a conventional LED bare die showing a metal bonding pad electrode formed on the top emitting face of the conventional LED bare die where it blocks the emission of light;

FIG. 45 is a top down view of an inventive LED bare die showing a top emissive face without a metal bonding pad electrode enabling unblocked emission of light;

FIG. 46 is a cross section of a light sheet having an inventive LED bare die as shown in FIG. 45 including electron injection facilitating material for connecting to the bare LED emissive face;

FIG. 47 is a cross sectional view of a light sheet having a side emitter LED bare die connected to a conductive line formed on a transparent substrate;

FIG. 57($b$) is a top view of the higher voltage light sheet shown in FIG. 57($a$) and cut from a multiple module light sheet constructed along the lines shown in FIGS. 58 through 60;

FIG. 64 shows an exploded view of an inventive construction of the light sheet utilizing a coin cell battery with LED bare die having appropriate polarity fixed directly to the positive and negative sides of the battery;

FIG. 65 shows an assembled view of the inventive construction of the light sheet shown in FIG. 64;

FIG. 67 shows a camouflaged housing for the inventive light sheet mimicking the color, size and texture of a rock;

DETAILED DESCRIPTION OF THE INVENTION

Figure 5:
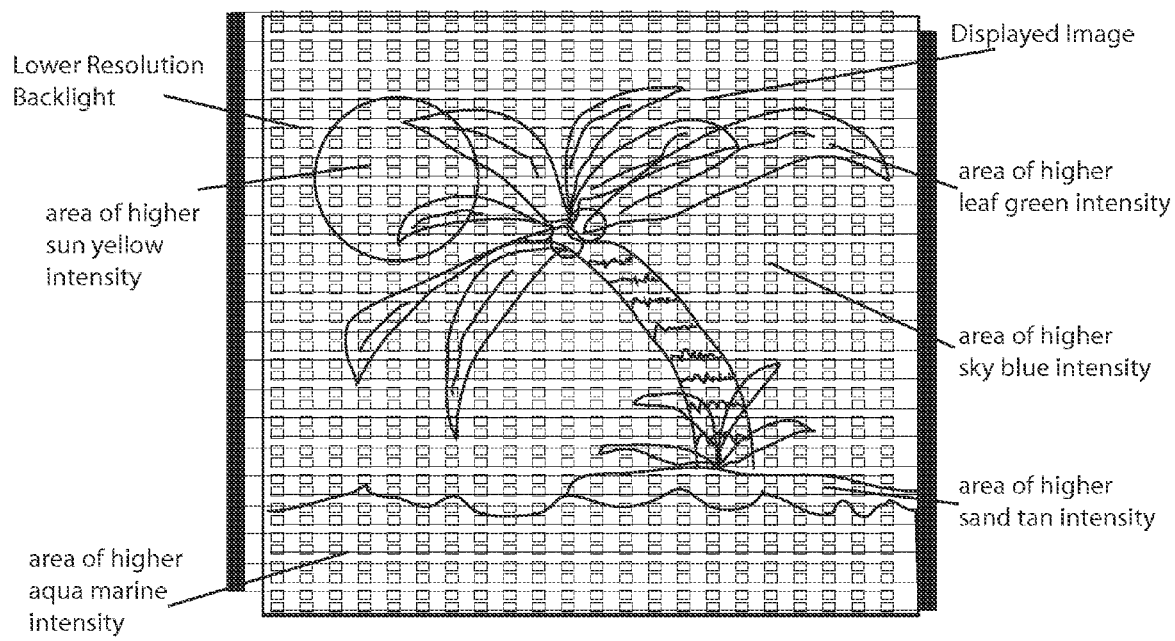
FIG. 5 illustrate driving the inventive RGGB variable color light sheet as a lower resolution variable color intensity back light for an LCD display.

For purposes of promoting an understanding of the principles of the invention, reference will now be made to the embodiments illustrated in the drawings and specific language will be used to describe the same. It will nevertheless be understood that no limitation of the scope of the invention is thereby intended, there being contemplated such alterations and modifications of the illustrated device, and such further applications of the principles of the invention as disclosed herein, as would normally occur to one skilled in the art to which the invention pertains.

FIG. 1 is a graph illustrating an AC driving voltage applied to red and blue LED devices having opposite polarity in accordance with an embodiment of the inventive RGGB variable color light sheet. FIG. 2 is a graph illustrating an AC driving voltage applied to green LED devices in accordance with an embodiment of the inventive RGGB variable color light sheet. FIG. 3 shows a comb electrode pattern having printed silver ink electrodes and printed transparent conductor pads. FIG. 4 illustrates the driving of two RGGB pixel elements in accordance with the embodiment of the inventive RGGB variable color light sheet.

Figure 6:
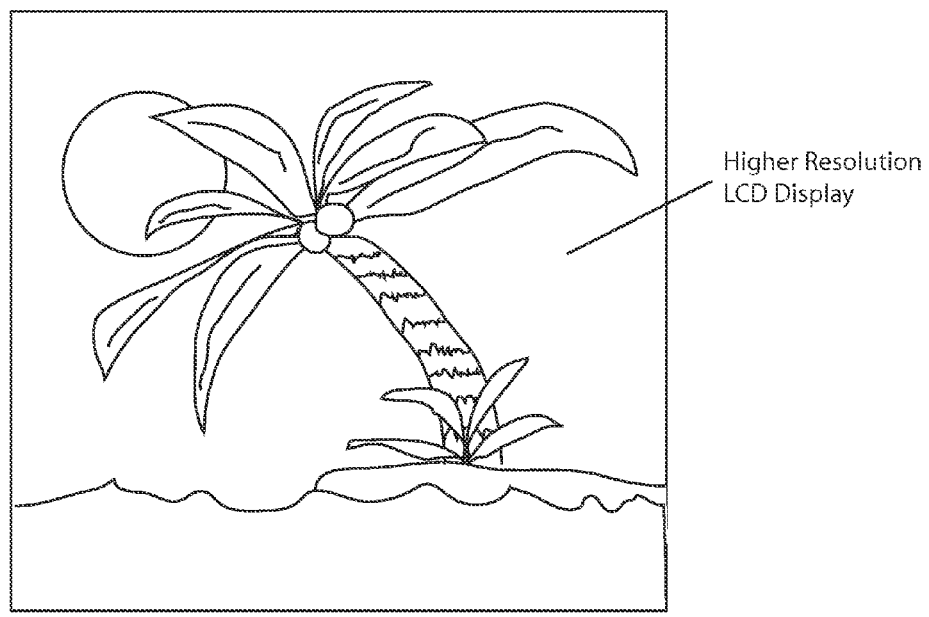
FIG. 6 shows an example of the higher resolution LCD image that is back lit by the variable color intensity back light show in FIG. 5.

FIGS. 1-4 shows a single layer RGB light sheet constructed so that the relative intensities of each color LED bare die can be controlled. This construction allows a light sheet to produce any color visible light including white. The bare dies are selected so that Blue and Red are opposite polarity. Blue and Red are on the same comb electrode pattern (i.e., blue bare die and red bare die on the same ITO pad). Green is on the other comb electrode pattern. The electrodes are driven with AC voltage, both comb electrodes may be in phase but driven with variable voltages. The amplitude of each leg of the blue/red AC driving voltage is adjustable to separately control the intensity of the blue and red emitting LEDs. The amplitude of the driving leg of the green AC driving voltage is adjustable to separately control the intensity of the green emitting LEDs. The electrode pattern can be an x and y grid enabling addressable RGB elements FIG. 5 illustrate driving the inventive RGGB variable color light sheet as a lower resolution variable color intensity back light for an LCD display. FIG. 6 shows an example of the higher resolution LCD image that is back lit by the variable color intensity back light show in FIG. 5. FIG. 5-6 show an inventive display backlight. A conventional backlight generates a uniform color, eg, white light, for backlighting a pixilated image display, such as an LCD filter. In accordance with the present invention, the backlight may be controlled to provide a lower resolution color source that matches the color of the image that is to be displayed through the LCD filter. In this example, the backlight area that is illuminating the yellow sun is controlled so that the appropriate backlight LED elements produce a relatively higher intensity yellow light. While, the backlight area that is illuminating the sky is controlled so that the appropriate backlight LED elements produce a relatively higher intensity blue light. The backlight is controlled in response to the image information (eg, a television signal) that is applied for controlling the higher resolution LCD filter array. By thus controlling the backlight, a more energy efficient, higher fidelity, improved image is displayed using, for example, an LCD video display.

Figure 7:
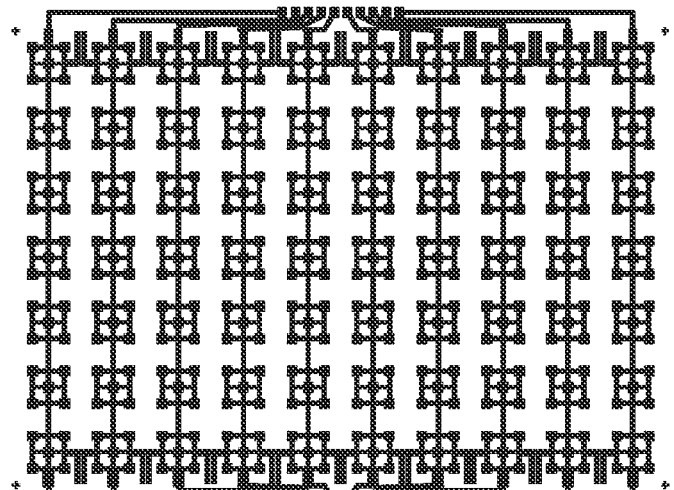
FIG. 7 is a back substrate silver ink pattern for a thin, flexible pixilated display tile.
Figure 8:
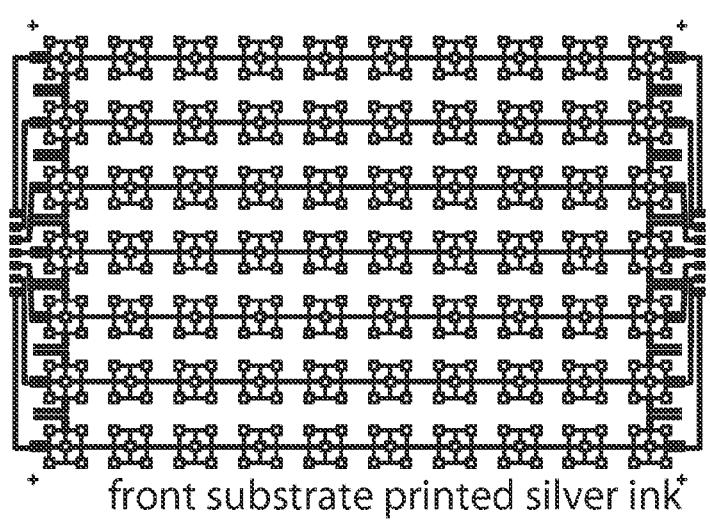
FIG. 8 is a front substrate silver ink pattern for the thin, flexible pixilated display tile.
Figure 9:
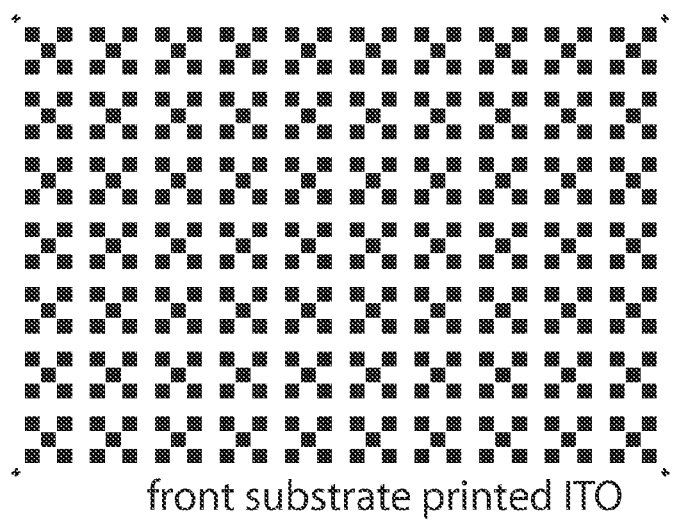
FIG. 9 is a front substrate transparent conductor (e.g., printed A-ITO) pattern for the thin, flexible pixilated display tile.
Figure 10:
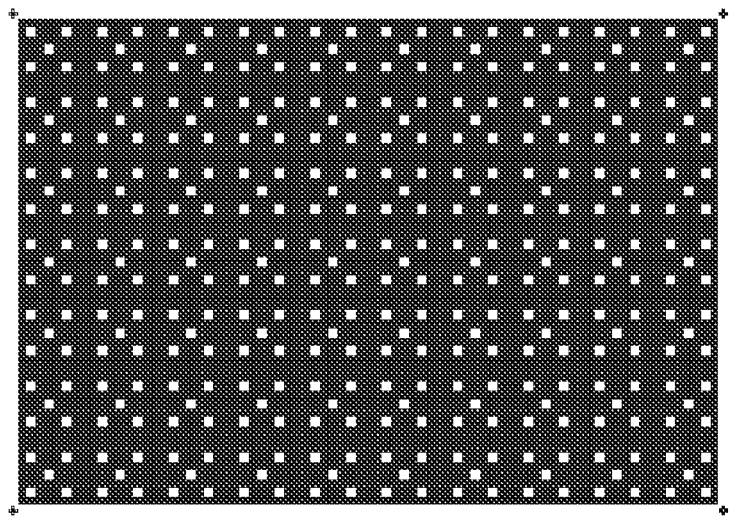
FIG. 10 is a front substrate insulation pattern for the thin, flexible pixilated display tile, the insulation pattern being provided to reduce cross-talk.
Figure 11:
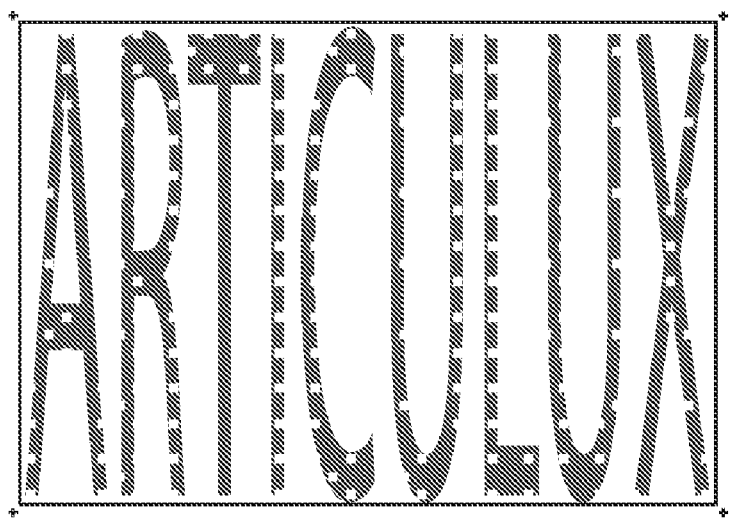
FIG. 11 is a front substrate printed signage pattern for the thin, flexible pixilated display tile.
Figure 12:
FIG. 12 illustrates the cross-section of the back (bottom) substrate silver ink pattern for a thin, flexible pixilated display tile.
Figure 13:
FIG. 13 illustrates the cross-section of the front substrate silver ink pattern for the thin, flexible pixilated display tile.
Figure 14:
FIG. 14 illustrates the cross-section of the front substrate transparent conductor (e.g., printed A-ITO) pattern formed on the front substrate silver ink pattern for the thin, flexible pixilated display tile.
Figure 15:
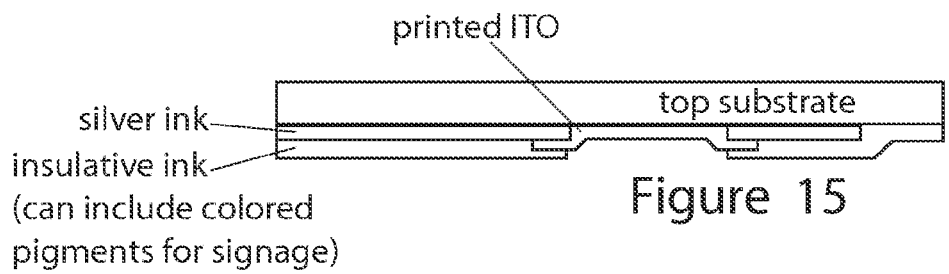
FIG. 15 illustrates the cross-section of the front substrate insulation pattern formed on the silver ink and transparent conductor patterns for the thin, flexible pixilated display tile, the insulation pattern being provided to reduce cross-talk.
Figure 16:
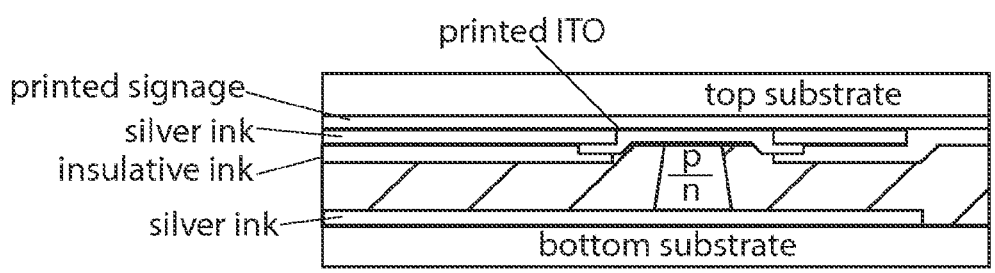
FIG. 16 illustrates the cross-section of the inventive thin, flexible pixilated display tile with a printed signage graphic.

FIG. 7 is a back substrate silver ink pattern for a thin, flexible pixilated display tile. FIG. 8 is a front substrate silver ink pattern for the thin, flexible pixilated display tile. FIG. 9 is a front substrate transparent conductor (e.g., printed A-ITO) pattern for the thin, flexible pixilated display tile. FIG. 10 is a front substrate insulation pattern for the thin, flexible pixilated display tile, the insulation pattern being provided to reduce cross-talk. FIG. 11 is a front substrate printed signage pattern for the thin, flexible pixilated display tile. FIG. 12 illustrates the cross-section of the back (bottom) substrate silver ink pattern for a thin, flexible pixilated display tile. FIG. 13 illustrates the cross-section of the front substrate silver ink pattern for the thin, flexible pixilated display tile. FIG. 14 illustrates the cross-section of the front substrate transparent conductor (e.g., printed A-ITO) pattern formed on the front substrate silver ink pattern for the thin, flexible pixilated display tile. FIG. 15 illustrates the cross-section of the front substrate insulation pattern formed on the silver ink and transparent conductor patterns for the thin, flexible pixilated display tile, the insulation pattern being provided to reduce cross-talk. FIG. 16 illustrates the cross-section of the inventive thin, flexible pixilated display tile with a printed signage graphic.

Figure 17:
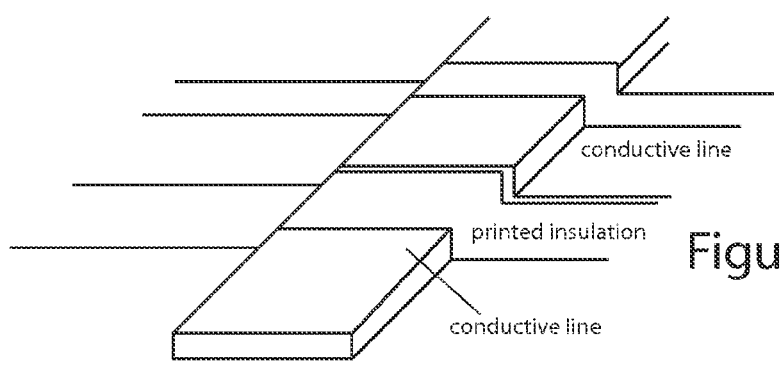
FIG. 17 illustrates a first printed conductive line formed under an insulating layer formed under a second crossing printed conductive line in accordance with an embodiment of the inventive electronic bare die circuit.

FIG. 17 illustrates a first printed conductive line formed under an insulating layer formed under a second crossing printed conductive line in accordance with an embodiment of the inventive electronic bare die circuit. FIG. 17 shows insulation material printed in a pattern that allows wiring lines to cross over without connection (insulation in between conductive lines), and to cross over with connection (no insulation between conductive lines). This feature enables complex electronic bare die and/or packaged die circuits.

Figure 18:
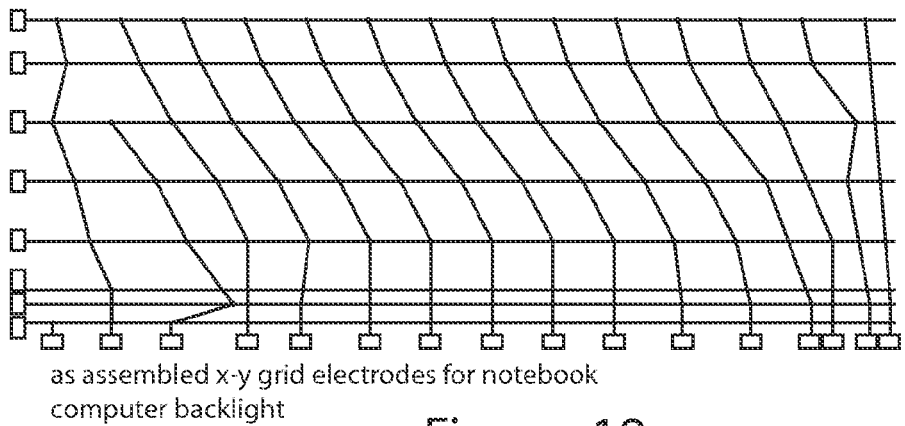
FIG. 18 illustrates an assembled x (bottom substrate) and y (top substrate) conductive pattern for a bare die LED backlight for a notebook computer.
Figure 19:
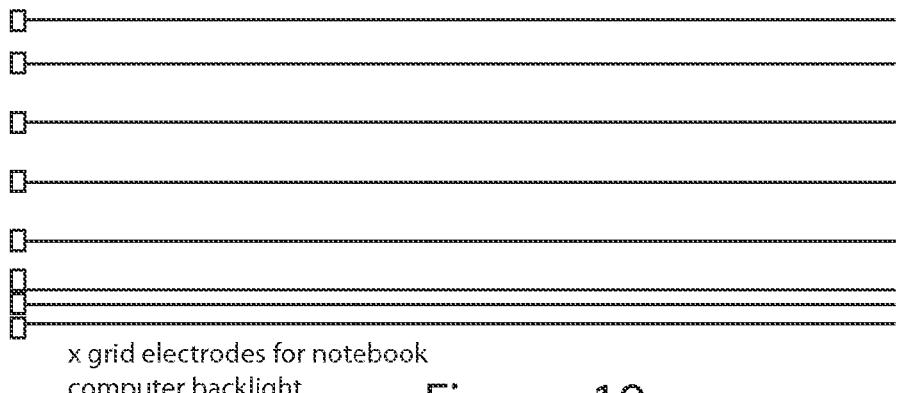
FIG. 19 illustrates the x (bottom substrate) conductive pattern for t bare die LED backlight for a notebook computer.
Figure 20:
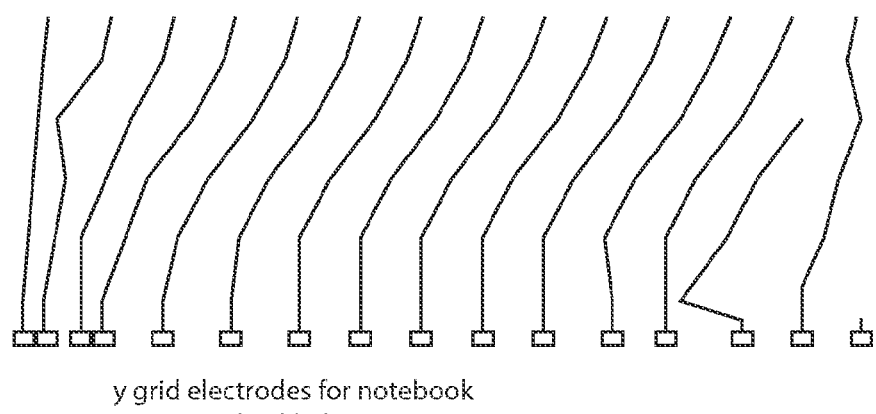
FIG. 20 illustrates the y (top substrate) conductive pattern for a bare die LED backlight for a notebook computer.

FIG. 18 illustrates an assembled x (bottom substrate) and y (top substrate) conductive pattern for a bare die LED backlight for a notebook computer. FIG. 19 illustrates the x (bottom substrate) conductive pattern for t bare die LED backlight for a notebook computer. FIG. 20 illustrates the y (top substrate) conductive pattern for a bare die LED backlight for a notebook computer. FIG. 18-20 shows a construction of the inventive light sheet that enables the keys of an electronic device keyboard to be individually lit up using something like a passive matrix driving circuit. An addressable keyboard light allows additional functionality to be provided for conveying information or entertaining a user. For example, keyboard shortcuts can be lit up and controlled by different software applications. E.g., the active keys for a software game can be lit. The keys can be controlled in response music being played through the computer speakers, etc. Variable colors can be obtained by providing two or more bare dies of driven to produce a desired color pattern. Additional buss lines, windows and pads can be provided to create a full-color RGB light. This version enables the keys or groups of keys to be lit up with any selected color.

FIG. 21 is a cross section unassembled view showing a top conductive surface on a top release sheet, a melt adhesive with embedded bare dies middle layer, and a bottom conductive surface on a bottom release sheet in accordance with an ultra-thin LED light sheet. FIG. 22 is a cross section assembled after lamination view showing the top conductive surface on a top release sheet, the melt adhesive with embedded bare dies middle layer, and the bottom conductive surface on a bottom release sheet in accordance with the ultra-thin LED light sheet. FIG. 23 is a cross section assembled view showing the peeling off of the top release sheet from the top conductive surface and the bottom release sheet from the bottom conductive surface in accordance with the ultra-thin LED light sheet. FIG. 24 is a cross section showing the resulting ultra-thin LED light sheet.

In accordance with this aspect of the invention, an ultra-thin electronically active sheet is provided. At least one bare die electronic element is embedded in an electrical insulator. The bare die electronic element has at least a first conductive feature and a second conductive feature left uncovered by the electrical insulator. A first conductive structure disposed on the electrical insulator is electrically connected to the first conductive feature. A second conductive structure disposed on the electrical insulator and electrically connected with the second conductive feature. This ultra-thin light sheet can be used, for example, for keyboard backlighting for mobile phones, PDAs and other devices where thinness and/or flexibility are particularly important.

Figure 25:
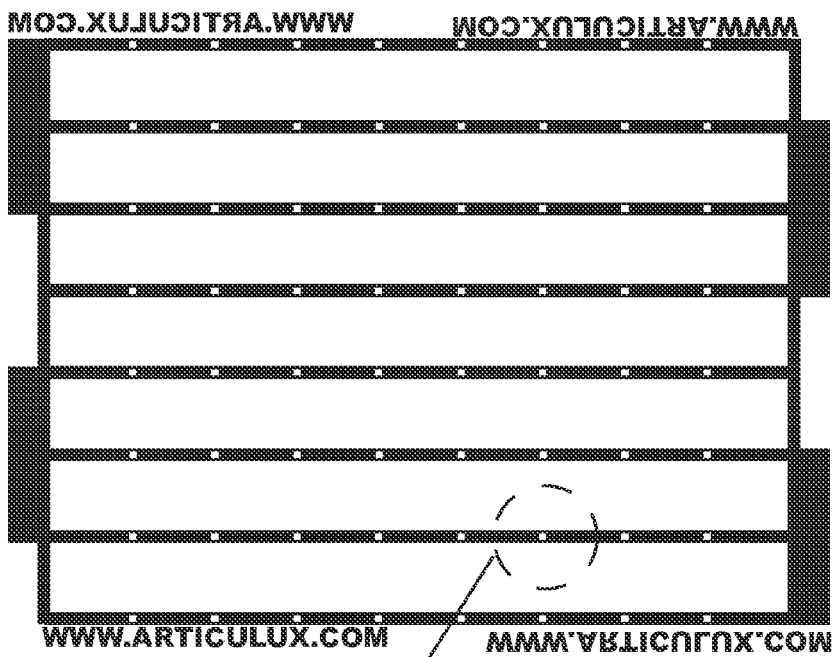
FIG. 25 shows a conductive pattern of an embodiment of the inventive light sheet that does not require a transparent conductive window for letting light emit from a top emitting LED die.
Figure 26:
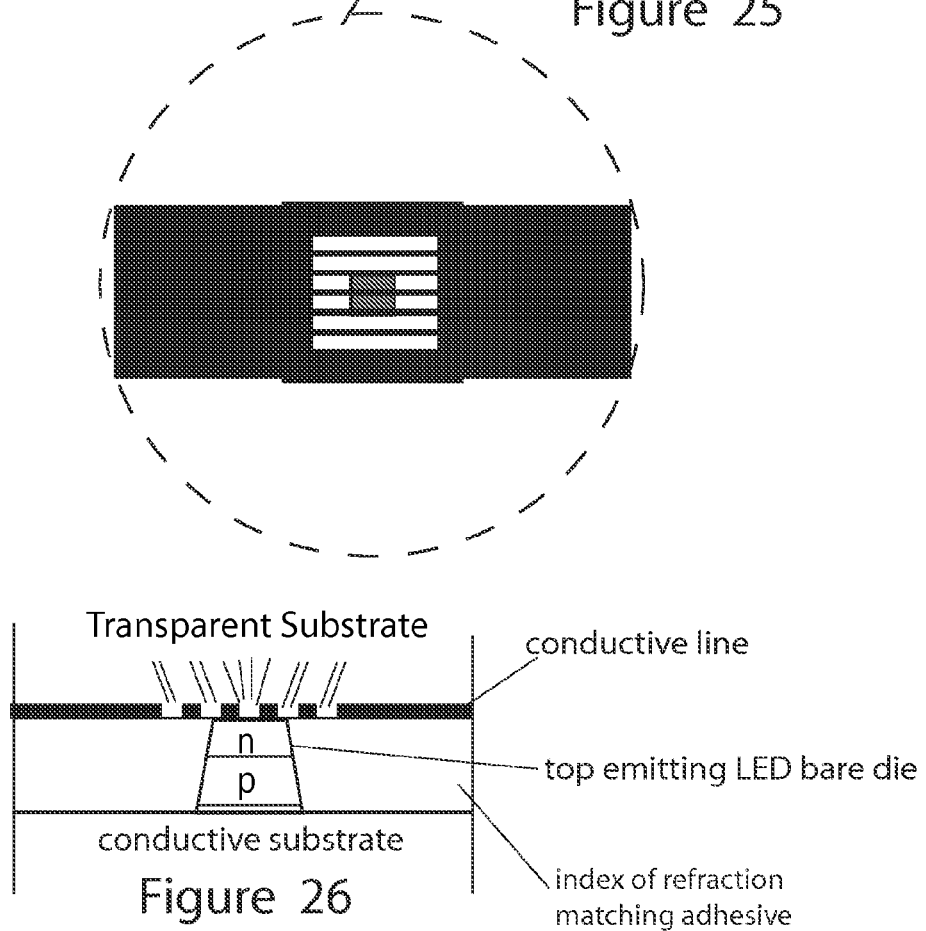
FIG. 26 is a close up view of a conductively patterned window for electrically connecting the conductive pattern to the top electrode of a top emitting LED die.

FIG. 25 shows a conductive pattern of an embodiment of the inventive light sheet that does not require a transparent conductive window for letting light emit from a top emitting LED die. FIG. 26 is a close up view of a conductively patterned window for electrically connecting the conductive pattern to the top electrode of a top emitting LED die. FIGS. 25-26 shows a light sheet construction that does not require a transparent conductor. A transmissive window is provided with thin conductive lines connected with thicker buss lines. The LED die is connected to the thin lines and light emitted from the LED is transmitted through the transmissive window. Alternatively, the transmissive window may be slightly smaller (at least in one dimension) than the edges of the bare die so that the bare die makes contact with the thicker buss lines. The conductive pattern enables light from bare die to emit through clear windows while the bare die is electrically connected with the patterned conductive lines.

Figures 27, 28, 29, 30, 31, 32, 33:
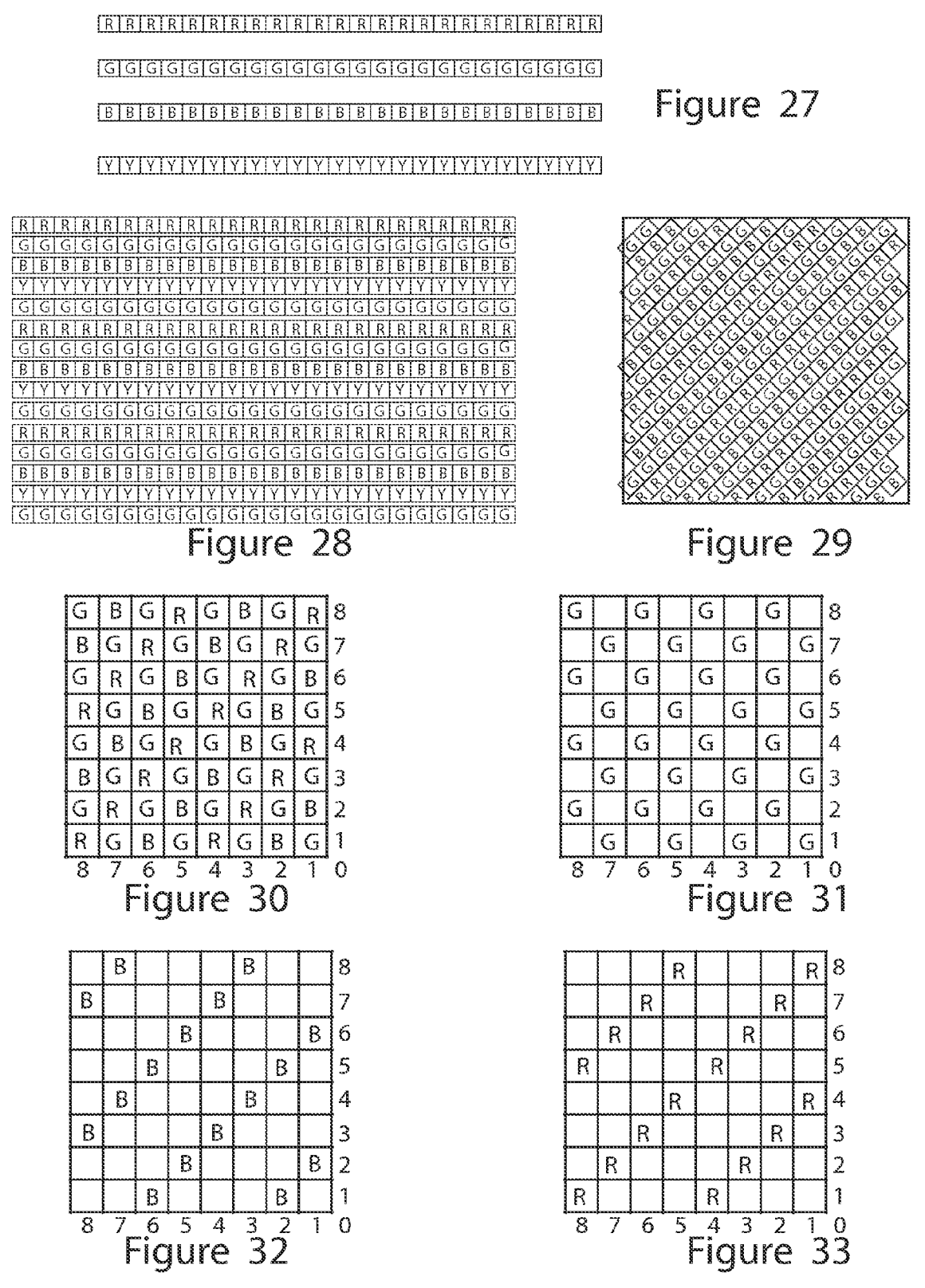

FIG. 27 illustrates individual RGBY light strips for an embodiment of the variable color and intensity light sheet. FIG. 28 shows the light strips assembled for an RGBYG variable color and intensity light sheet. FIG. 29 shows an alternative assembled RGBG variable color and intensity light sheet. FIG. 30 illustrates the pattern of the alternative assembled RGBG variable color and intensity light sheet shown in FIG. 29. FIG. 31 illustrates the G (green emitting LED die) pattern. FIG. 32 illustrates the B (blue emitting LED die) pattern. FIG. 33 illustrates the R (red emitting LED die) pattern;

FIGS. 27-33 show a white light (e.g. display backlight) formed by separate light strips for each color. This construction enables fine tuning of the materials and processes for each particular bare die type.

Figure 37:
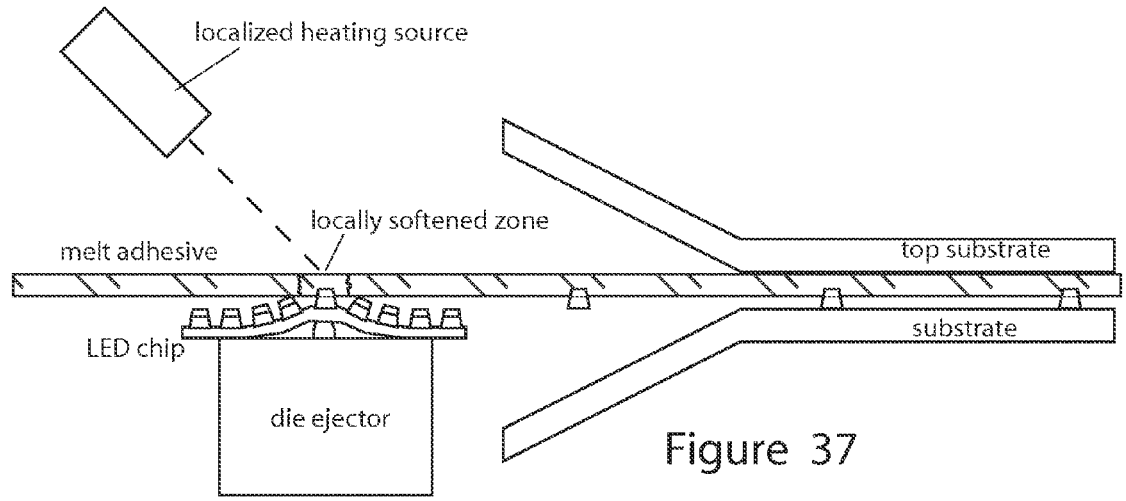
FIG. 37 illustrates a method of placing LED bare dies or electronic circuit semiconductor elements directly from a wafer tape into a melt adhesive.
Figure 38:
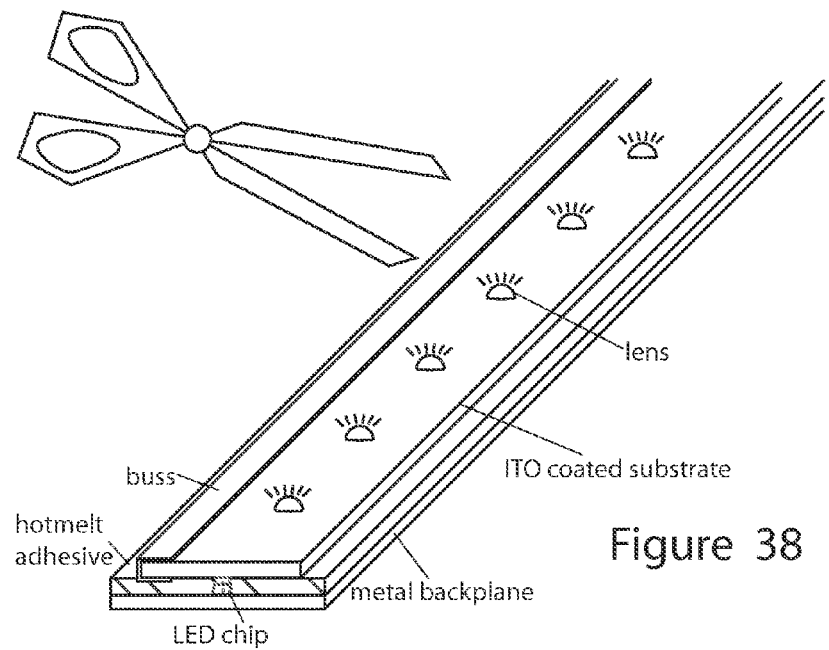
FIG. 38 shows the construction of a light tape that can be cut to length.

FIG. 34 shows the cross sections of the individual color strips of RGBG light strips showing the differences in bare die height. FIG. 35 illustrates the use of different adhesive thicknesses to accommodate the difference in bare die height. FIG. 36 illustrates the use of a thickness increasing material to accommodate the difference in bare die height. For example, bare die heights vary depending on color, foundry and recipe. Bare die LEDs can have a vertical (top bottom) or horizontal (top top) electrode pattern. The inventive construction enables the correct thickness and formula adhesive, conductive lines, and substrates used to optimize the light output for each bare die type used to construct the inventive FIG. 37 illustrates a method of placing LED bare dies or electronic circuit semiconductor elements directly from a wafer tape into a melt adhesive. FIG. 38 shows the construction of a light tape that can be cut to length. FIGS. 37-38 show a light strip made by providing electrical contact with the conductive surface of the top substrate, so that a connection can be made through the buss to the conductive surface and to the LED die. The buss and the conductive bottom substrate provide a conductive pathway to each LED such that the light strip can be cut anywhere along its length. An electrical connection to the buss and the conductive bottom substrate of each cut strip energizes the LEDs and generates light.

Figure 39:
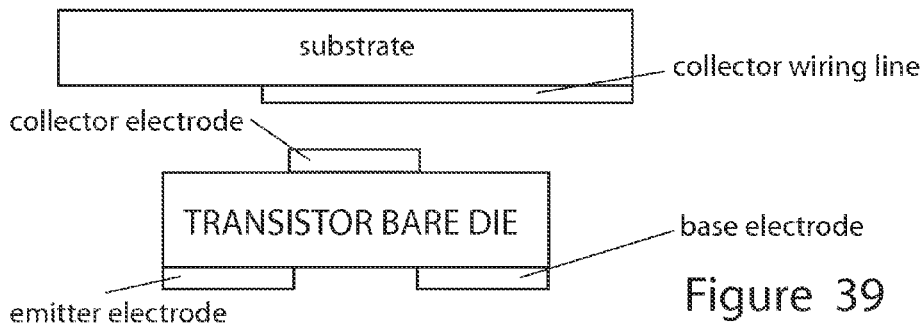
FIG. 39 is an exploded cross sectional view showing a bare die transistor element connected with a connection enhancing material to a thin, flexible, encapsulated electronic circuit in accordance with the present invention.

FIG. 39 is an exploded cross sectional view showing a bare die transistor element connected with a connection enhancing material to a thin, flexible, encapsulated electronic circuit in accordance with the present invention.

Figure 40:
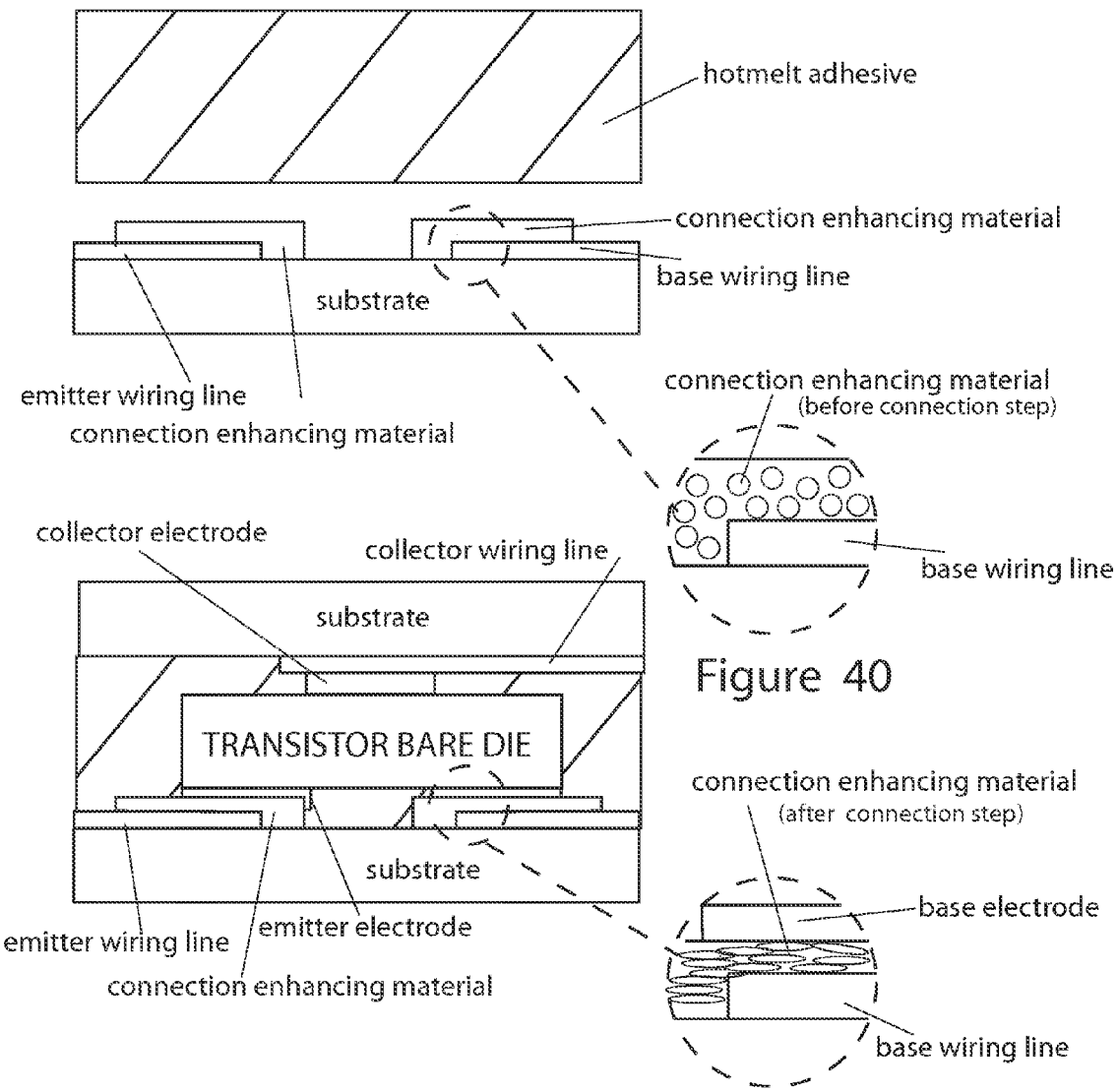
FIG. 40 is an assembled cross sectional view showing the bare die transistor element connected with the connection enhancing material to the thin, flexible, encapsulated electronic circuit.

FIG. 40 is an assembled cross sectional view showing the bare die transistor element connected with the connection enhancing material to the thin, flexible, encapsulated electronic circuit.

Figure 41:
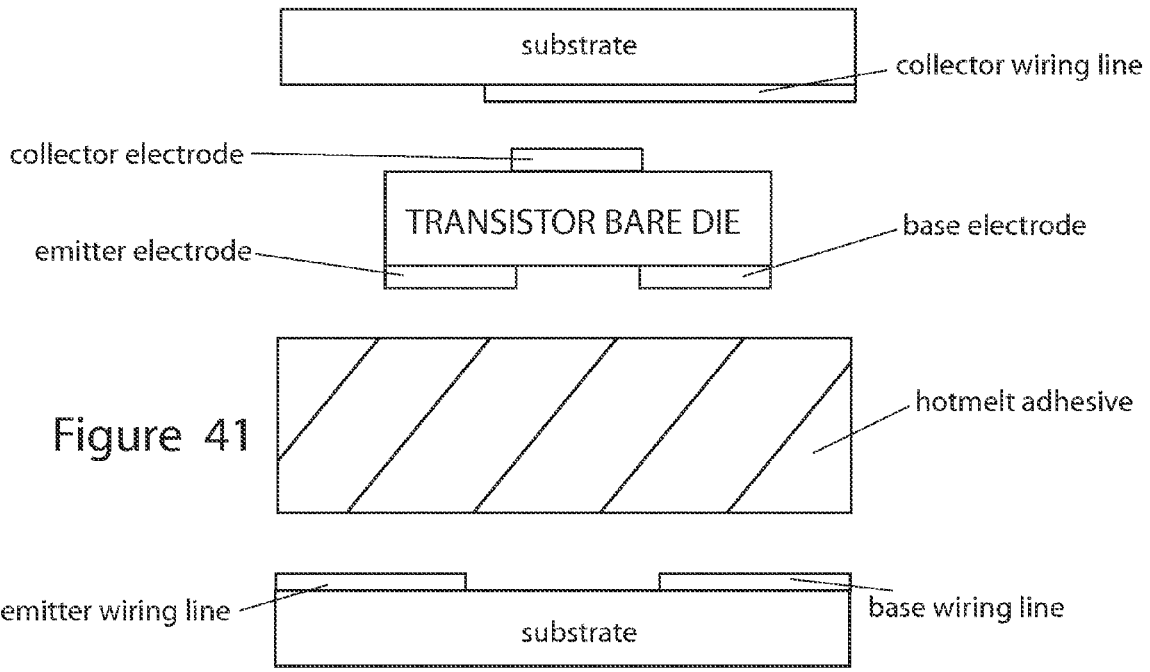
FIG. 41 is an exploded cross sectional view showing a bare die transistor element connected directly to wiring lines of a thin, flexible, encapsulated electronic circuit in accordance with the present invention.
Figure 42:
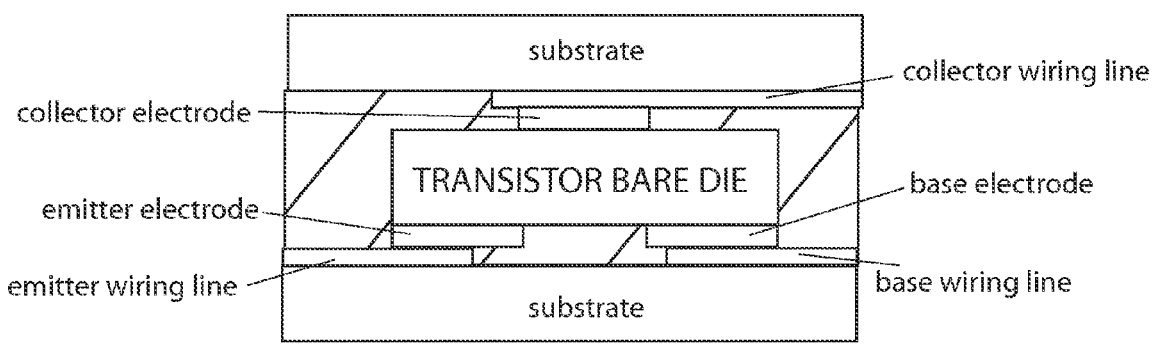
FIG. 42 is an assembled cross sectional view showing the bare die transistor element connected directly to wiring lines of the thin, flexible, encapsulated electronic circuit.

FIG. 41 is an exploded cross sectional view showing a bare die transistor element connected directly to wiring lines of a thin, flexible, encapsulated electronic circuit in accordance with the present invention. FIG. 42 is an assembled cross sectional view showing the bare die transistor element connected directly to wiring lines of the thin, flexible, encapsulated electronic circuit. FIGS. 41-42 show a connection enhancing material which can be a conductive adhesive, such as a z-axis conductor, or a low temperature alloy that softens or melts during the lamination process or during a connection-making heat and pressure process. A printable ink may be used that includes low melt conductive particles in a binder. Additional conductivity enhancing materials can be included in the ink as well. The connection enhancing material provides a mechanical and electrical connection to the electrodes of the bare die device. In a connection step, the connection enhancing elements (e.g., round balls) are compressed and may be deformed into interconnecting elements (e.g., platelets) to secure a good electrical connection between the electrodes of the bare die device and the wiring lines.

In accordance with the present invention, a bare die semiconductor electronic circuit is provided comprising a first substrate having a bottom side surface having at least a first and a second conductive line. A second substrate is disposed adjacent to the first substrate. The second substrate has a top side surface having a third conductive line. A least one bare die semiconductor electronic circuit element having a first electrode and a second electrode disposed on an obverse side and a third electrode disposed on a reverse side is provided. As shown in FIG. 42, a bare die transistor circuit element is connected directly to wiring lines or lands printed on flexible substrates. An adhesive adheres the first substrate to the second substrate and binds the bare die semiconductor electronic circuit element to the first substrate and to the second substrate. The adhesive maintains the first electrode in electrical communication with the first conductive line, the second electrode in electrical communication with the second conductive line, and the third electrode is in electrical communication with the third conductive line. At least one of the first and the second substrate may be a flexible plastic sheet, such as PET, PEN, Kapton, polycarbonate, vinyl, and the like. At least one of the first, second and third wiring line can formed from a printed conductive ink, such as through silk screen, inkjet, gravure, donor sheet, electrostatic or other printing methods. Alternatively, the conductive lines can be formed by etching. The adhesive may be at least one of a hot melt and thermosetting adhesive. Alternatively, the adhesive may be at least one of a thermally active adhesive, a catalyst active adhesive, a solvent evaporation active adhesive and a radiation active adhesive.

Figure 43:
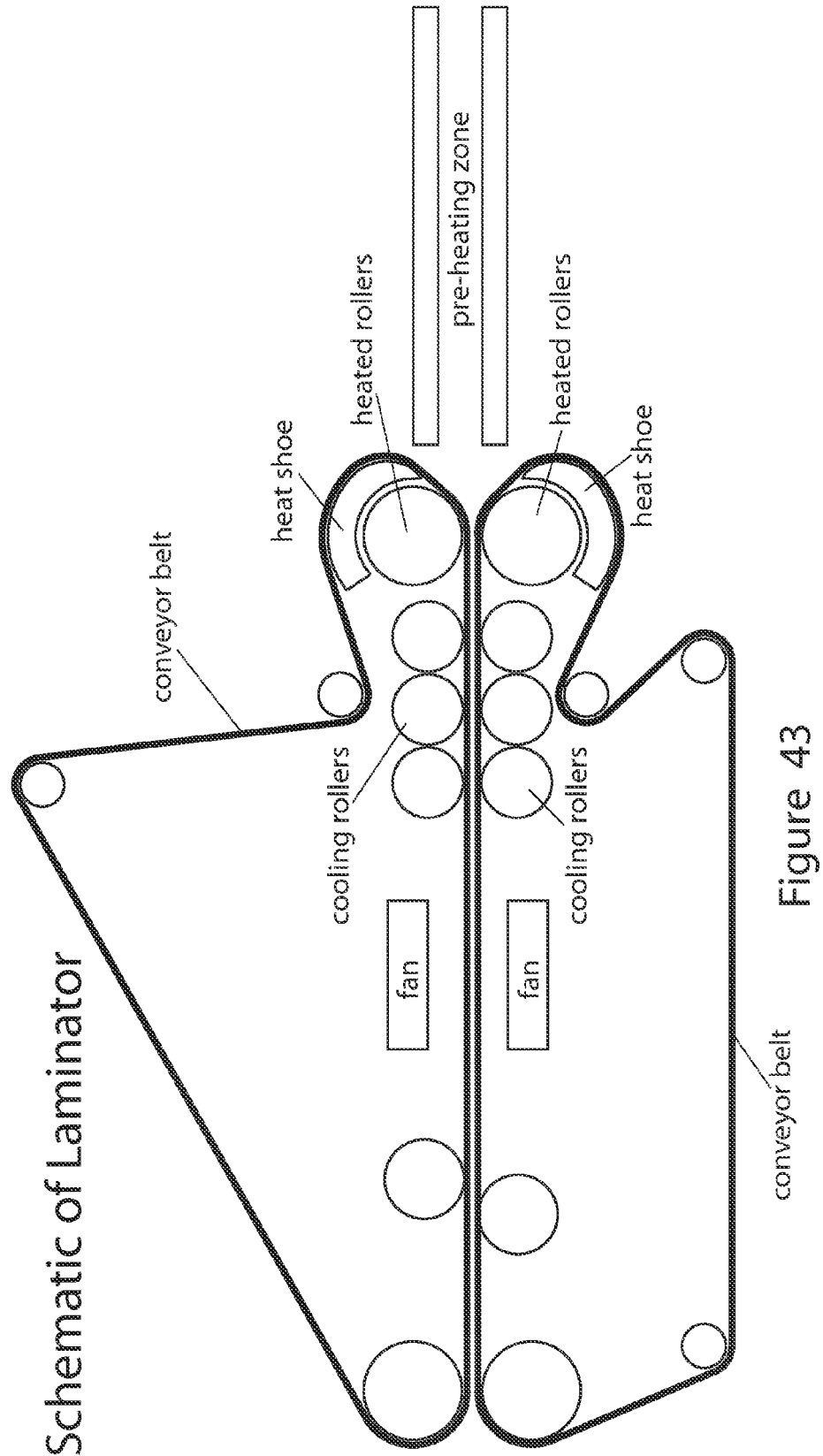
FIG. 43 is a schematic view illustrating a roll laminator for manufacturing an encapsulated electronic bare die circuit in accordance with the present invention.

FIG. 43 is a schematic view illustrating a roll laminator for manufacturing an encapsulated electronic bare die circuit in accordance with the present invention. FIG. 43 shows a laminator for manufacturing the inventive light sheet. A pre-heating zone raises the thermal energy of the lamination sandwich. The heat shoes heat the conveyor belts and the heated rollers (which may be separately heated). The conveyor belts maintain positive pressure on the lamination package as it cools. The cooling rollers may be provided to add pressure and speed cooling of the lamination to lock in the electrical connections between the electrically conductive element as the hot melt adhesive cools. Fans and chill rollers may be provided to further take heat from the lamination package.

Figure 48:
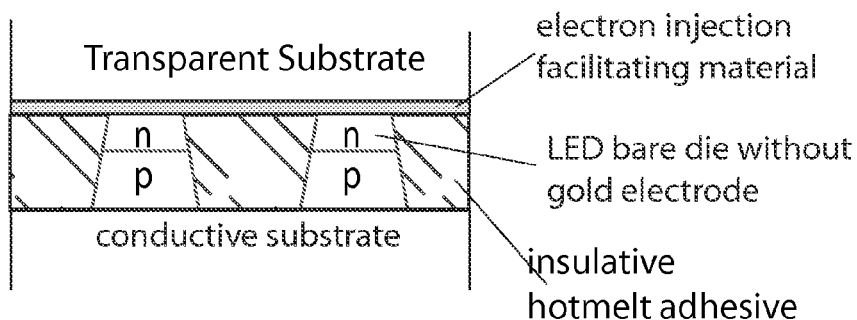
FIG. 48 is a cross section of a light sheet having a conventional LED bare die as shown in FIG. 44 including electron injection facilitating material for connecting to the metal bonding pad electrode formed on the LED emissive face.

FIG. 44 is a top down view of a conventional LED bare die showing a metal bonding pad electrode formed on the top emitting face of the conventional LED bare die where it blocks the emission of light. FIG. 45 is a top down view of an inventive LED bare die showing a top emissive face without a metal bonding pad electrode enabling unblocked emission of light. FIG. 46 is a cross section of a light sheet having an inventive LED bare die as shown in FIG. 45 including electron injection facilitating material for connecting to the bare LED emissive face. FIG. 47 is a cross sectional view of a light sheet having a side emitter LED bare die connected to a conductive line formed on a transparent substrate. FIG. 48 is a cross section of a light sheet having a conventional LED bare die as shown in FIG. 44 including electron injection facilitating material for connecting to the metal bonding pad electrode formed on the LED emissive face.

In accordance with this aspect of the invention, an electronically active sheet includes a bottom substrate having a bottom electrically conductive surface. A top substrate having a top electrically conductive surface is disposed facing the bottom electrically conductive surface. An electrical insulator separates the bottom electrically conductive surface from the top electrically conductive surface. At least one bare die electronic element is provided having a top conductive side and a bottom conductive side. Each bare die electronic element is disposed so that the top conductive side is in electrical communication with the top electrically conductive surface and so that the bottom conductive side is in electrical communication with the bottom electrically conductive surface.

The electrical insulator may comprise a hotmelt adhesive. Each bare die electronic element is embedded in the hot melt electrical insulator with the top conductive side and the bottom conductive side left uncovered by the electrical insulator. The electrical insulator binds the top substrate to the bottom substrate with the top conductive side of the bare die electronic element in electrical communication with the top electrically conductive pattern of the top substrate, and so that the bottom conductive side of the bare die electronic element is in electrical communication with the bottom conductive pattern of the bottom substrate. At least one electronic element may comprise a solid state semiconductor light emitting diode bare die.

As shown, for example, in FIGS. 39 through 42, the bare die electronic element can include a first conductor and a second conductor both disposed on either the top conductive side and the bottom conductive side, and wherein said bare die electronic element is disposed so that the first conductor and the second conductor are in electrical communication with respective wiring lines formed on either the top substrate and the bottom substrate.

As shown, for example, in FIG. 7 through 16, the top and bottom conductive patterns formed on the top and bottom substrates can be printed, etched, or otherwise electrically isolated and patterned to form electrode grids. The bare die electronic element may be plurality of individual bare die LED elements. The bottom electrically conductive surface and the top electrically conductive surface can thus be formed as a respective x and y wiring grid for selectively addressing the individual bare die LED elements for forming a display.

A phosphor or other re-emitter can be provided in or on at least one of the top substrate and the bottom substrate (or adjacent thereto), or formed in the electrical insulator. The phosphor or other re-emitter is optically stimulated by a radiation emission of a first wavelength from the light active semiconductor element to emit light of a second wavelength. Alternatively, the phosphor can be disposed between the top and bottom conductive surfaces and electrically stimulated to emit light. In this construction electronic circuit elements, such as LED bare die, can be incorporated into a light sheet integrally formed with an electroluminescent (EL) phosphor light element.

Figure 49:
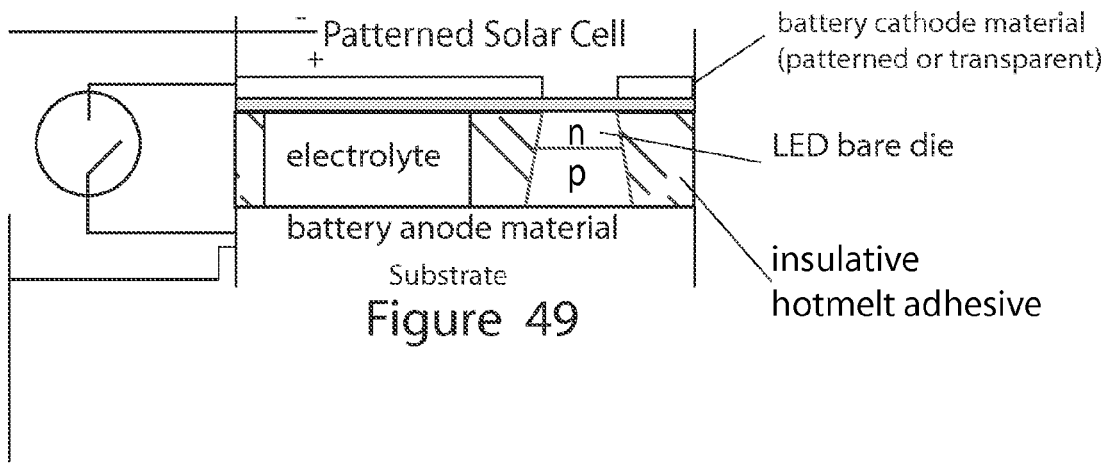
FIG. 49 is a cross sectional view of an inventive self-contained battery and solar cell integrally formed with the inventive light sheet.

FIG. 49 is a cross sectional view of an inventive self-contained battery and solar cell integrally formed with the inventive light sheet. FIG. 49 shows a light sheet construction wherein a battery cathode may be, for example, film of lithium metal. The battery anode material can be a carbon material component of a conventional Li battery. A solar cell, patterned to allow light to escape, can be provided to charge the battery. A light sensitive switch can be provided so that the LEDs turn on at a certain ambient darkness. Elements of the light sensitive switch circuit can be provided as bare die connected within the light sheet. The result is a very thin, flexible, self-charging, automatic turn-on light sheet system. The system may be used, for example, as an IR emissive sheet for military use, to mark streets with visible light patterns, to provide decorative or architectural lighting, etc.

Figure 50:
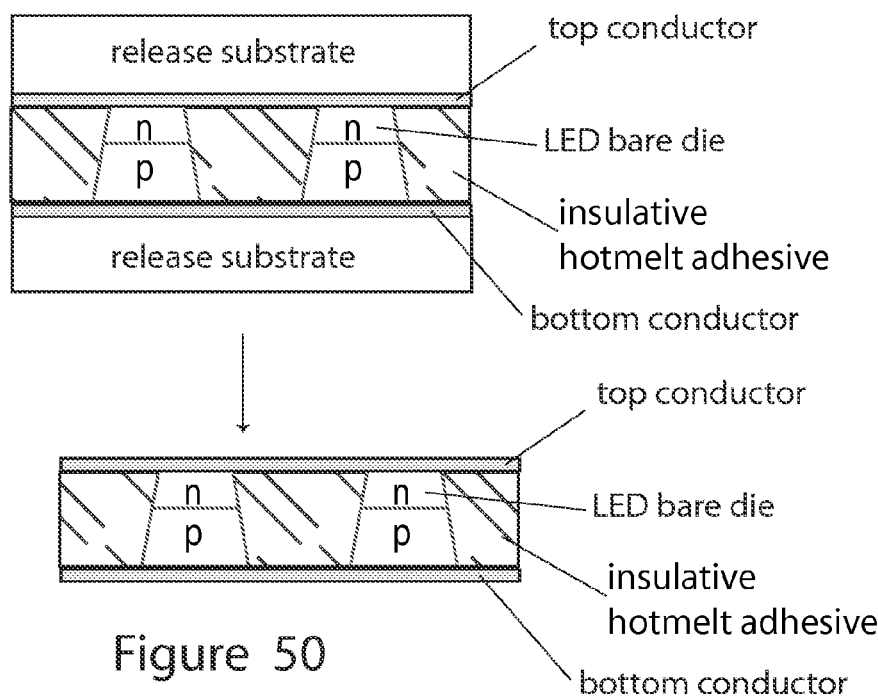
FIG. 50 is a cross section of an ultra-thin construction of the inventive light sheet.

FIG. 50 is a cross section of an ultra-thin construction of the inventive light sheet. FIG. 50 shows an ultra-thin light sheet. A release substrate is coated with a top conductor and a bottom conductor. When release sheet is removed, the adhesive holds the device components together resulting in ultra-thin light sheet. Applications include mobile phone keypads, backlights, etc.

Figure 51:
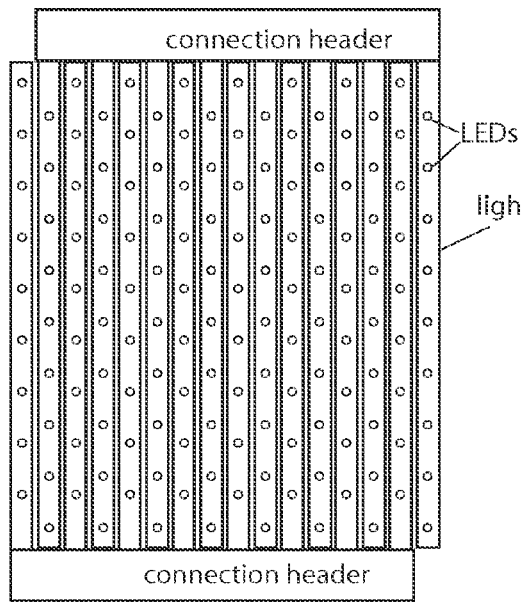
FIG. 51 illustrates a light sheet construction for making multiple devices cut from a single light sheet.
Figure 52:
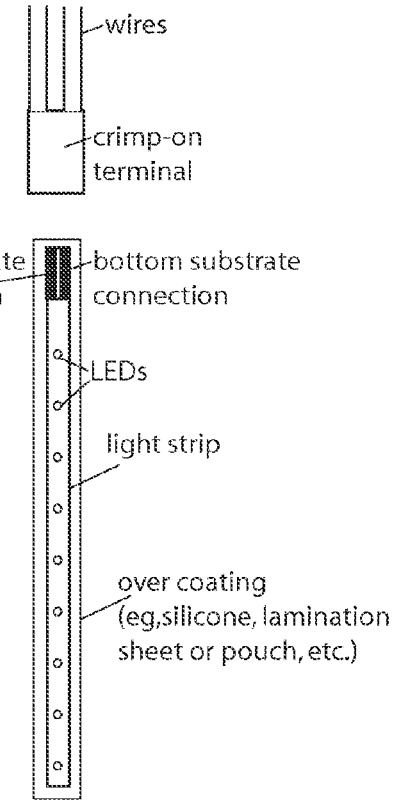
FIG. 52 shows a light strip cut from the single light sheet shown in FIG. 52 showing a crimp-on terminal connector.
Figure 53:
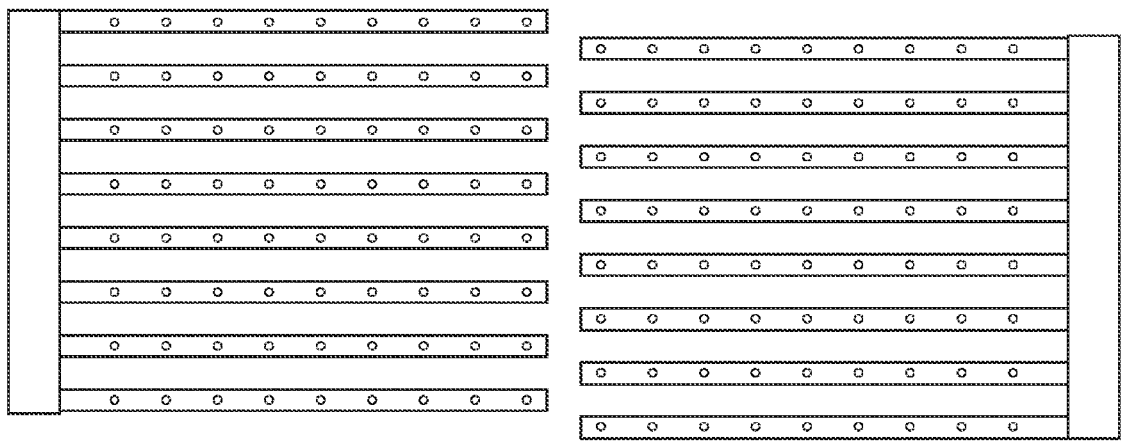
FIG. 53 shows a multiple-strip light strip cut from the single light sheet shown in FIG. 52.

FIG. 51 illustrates a light sheet construction for making multiple devices cut from a single light sheet. FIG. 52 shows a light strip cut from the single light sheet shown in FIG. 52 showing a crimp-on terminal connector. FIG. 53 shows a multiple-strip light strip cut from the single light sheet shown in FIG. 52. FIG. 51-53 shows hole punches and knife slices through substrate(s) can be used to create control line patterns before and/or after the lamination process. The hole punches and knife slices are used to cut wiring lines to provide desired circuit constructions.

Figure 54:
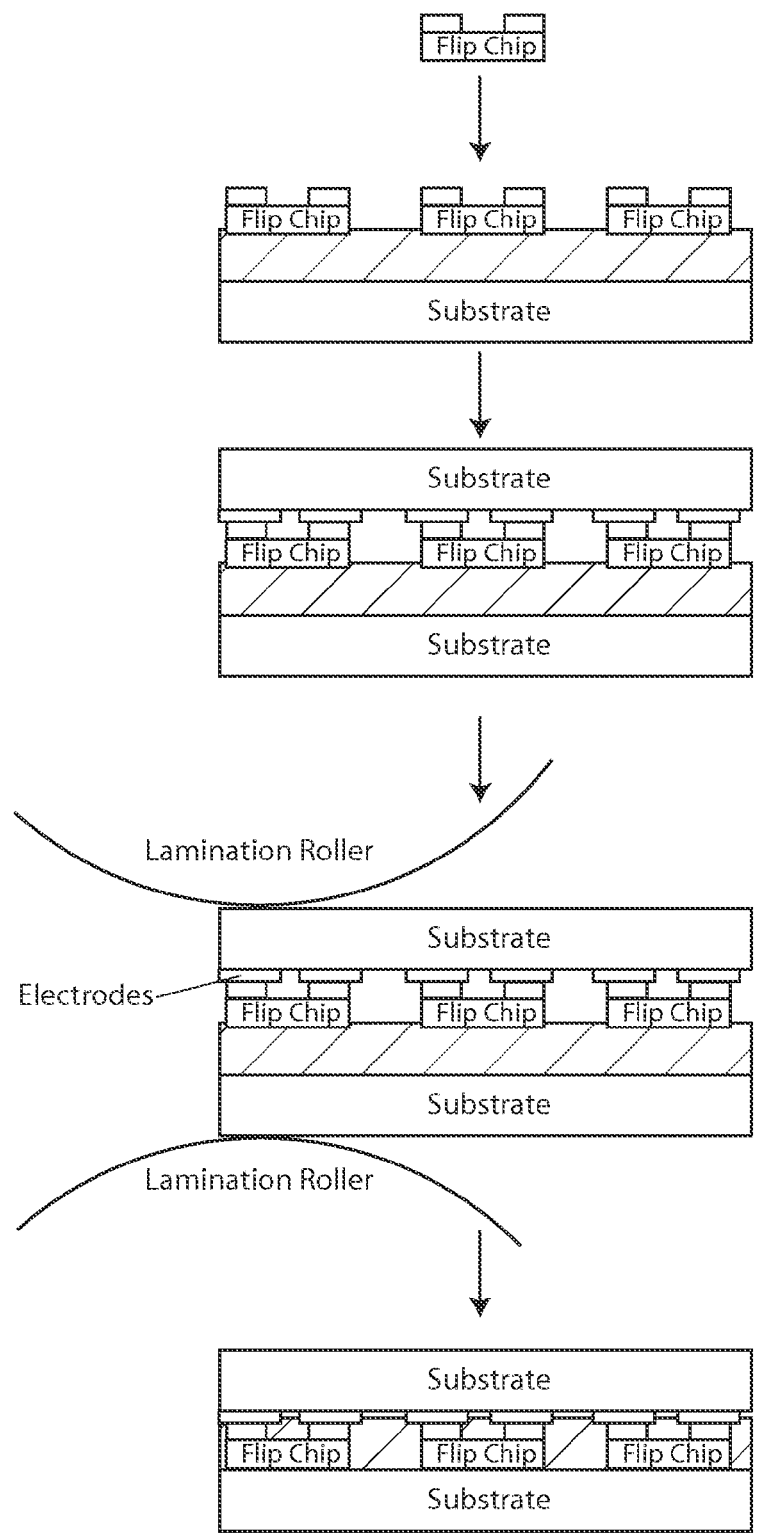
FIG. 54 shows an inventive method of forming an electrical connection to bare die electrodes of a flip-chip style bare die semiconductor device.

FIG. 54 shows an inventive method of forming an electrical connection to bare die electrodes of a flip-chip style bare die semiconductor device. A flip-chip style die is placed directly onto a hot melt adhesive layer formed on a substrate. A top substrate is provided having electrode land patterns corresponding to the electrodes of the flip-chip style die. Other circuit elements and conductive lines can be included (not shown). The top substrate is registered (through alignment pins (not shown) etc.) to the bottom substrate so that the chip electrodes and the respective electrode lands come into to face-to-face electrical contact. The thus-formed lamination sandwich is laminated through a roll or press lamination process so that the flip-chip style die are pressed into and encapsulated by the hot melt adhesive. The flip-chip style die are completely encapsulated by the top and bottom substrate, and the hot melt adhesive. The hot melt adhesive also securely fixes the two substrates together forming a durable, flexible, protected electronic circuit.

Figure 55:
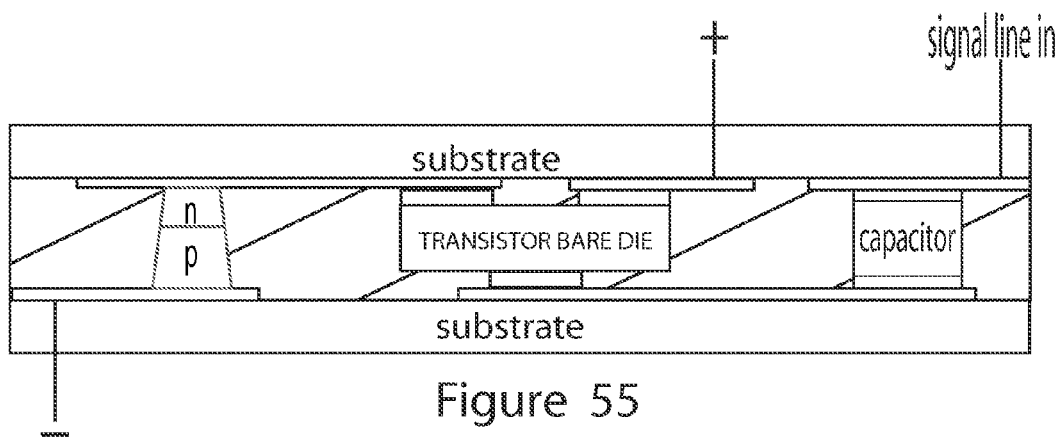
FIG. 55 shows an electronic circuit formed using the inventive bare die electronic circuit manufacturing method for connecting a bare die capacitor, a bare die transistor and a bare die LED.
Figure 56:
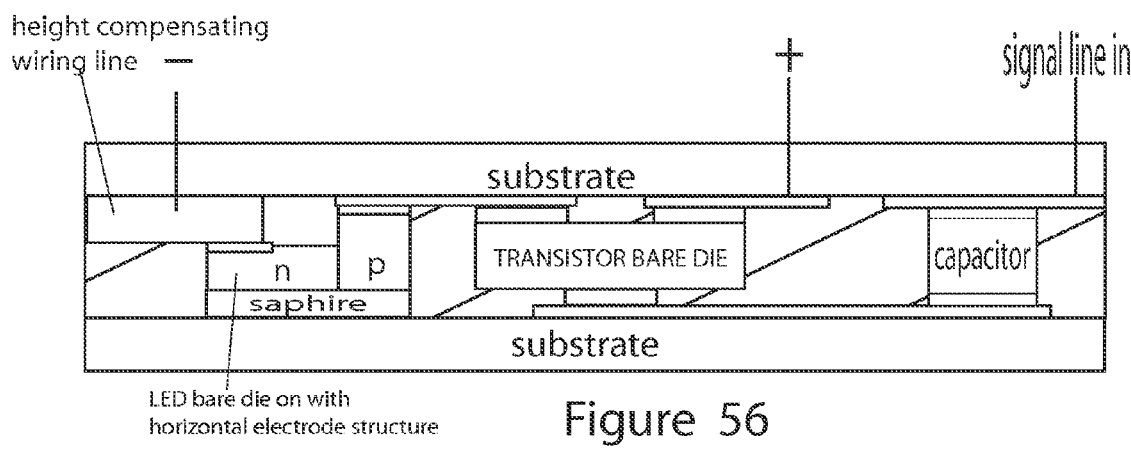
FIG. 56 shows an electronic circuit similar to FIG. 55 with a height compensating wiring line formed on a substrate for compensating a difference in heights of a horizontal electrode structure LED bare die.

FIG. 55 shows an electronic circuit formed using the inventive bare die electronic circuit manufacturing method for connecting a bare die capacitor, a bare die transistor and a bare die LED. FIG. 56 shows an electronic circuit similar to FIG. 55 with a height compensating wiring line formed on a substrate for compensating a difference in heights of a horizontal electrode structure LED bare die. FIGS. 55-56 show a bare die pixel matrix. When a signal is applied to capacitor, the transistor passes current through the LED bare die for the duration of the capacitor discharge. Other elements and other constructions are possible, using bare die or hybrid of bare die and conventional packaged electronic elements. The height compensating wiring line enables uneven electrodes to be connected. The height compensating wiring lines can also be used to allow chips of different heights to be provided on the same device.

In accordance with this aspect of the invention, a first substrate is provided having bottom side surface having at least a first and a second conductive line. A bare die semiconductor electronic circuit element is provided having a first electrode and a second electrode disposed on an obverse side. An adhesive encapsulates and adheres the bare die semiconductor electronic circuit element to the first substrate so that the first electrode is in electrical communication with the first conductive line and the second electrode is in electrical communication with the second conductive line. A second substrate can be disposed adjacent to the first substrate and bound to the first substrate by the adhesive.

The second substrate can include a top side surface having a third conductive line. The bare die semiconductor electronic circuit element includes a third electrode disposed on its reverse side. The adhesive encapsulates and adheres the bare die semiconductor electronic circuit element to the second substrate so that said third electrode is in electrical communication with the third conductive line.

An electrically conductive through-hole can be disposed in either the first substrate and/or the second substrate for electrically connecting the bare die semiconductor electronic circuit element to a conductive element disposed on a top side surface of the first substrate and/or on a bottom side surface of the second substrate.

A second bare die semiconductor electronic circuit element can be provided having at least one electrode. The adhesive encapsulates and adheres the second bare die semiconductor electronic circuit element to the first substrate so that the electrode of the second bare die semiconductor electronic circuit element is in electrical communication with at least one of the first electrode and the second electrode through the respective first and second conductive line.

Figure 57A:
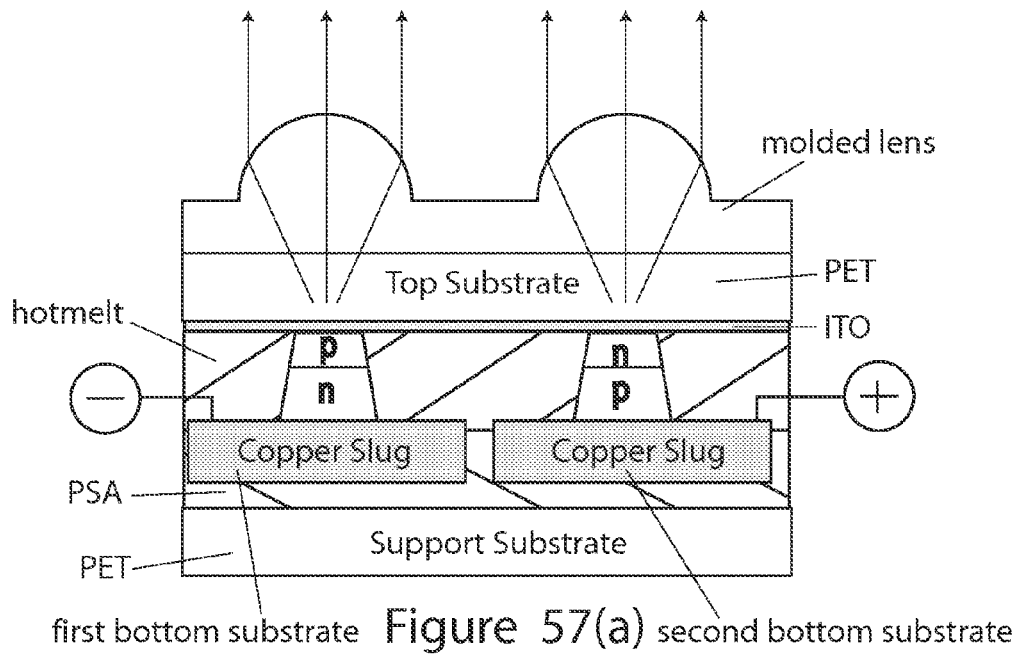
FIG. 57($a$) is a cross sectional view of a higher voltage light sheet utilizing opposite polarity LED bare die for forming a series connection resulting in a higher device voltage.

FIG. 57(a) is a cross sectional view of a higher voltage light sheet utilizing opposite polarity LED bare die for forming a series connection resulting in a higher device voltage. As shown, copper strips or slugs are provided as conductive bottom substrates and heat sinks. The copper strips may be fixed together by a pressure sensitive adhesive and supported on a supports substrate, such as PET, forming a bottom composite substrate. A hot melt adhesive layer is adhered to the bottom composite substrate. LED die of a first polarity are encapsulated in the adhesive on a first copper strip and LED die of a second polarity are encapsulated in the adhesive on a second copper strip. The bottom conductor of the LED die are in electrical communication with the respective first and second copper strips. A conductive top substrate is provided in electrical contact with the top conductors of both LED die. A lens may be provided on top of or integrally formed with the top substrate to enhance the beam pattern produced by the LED die. Since the LED die are of opposite polarity, a completed circuit is formed when a voltage of a first polarity if applied to the first copper strip and a voltage of a second polarity is applied to the second copper strip. The resistance value of the conductive top substrate can be selected to provide an in-series ballast resistor so that the voltage applied at the copper strips can be tailored for specific applications, such as a 12 volt automobile power source.

This construction can be used to create a light sheet that can be plugged directly into a household current. The resistance values can be minimized to create a high efficiency solid state lighting system that can be driven with a constant current power supply. This construction is adaptable to a roll-to-roll or sheet fabrication process, with daughter modules of desired driving voltage being cut from a mother board-type sheet or roll. This construction can be used for source lighting, display back lighting, transportation signal, interior and exterior lighting and many other applications.

Figure 57B:
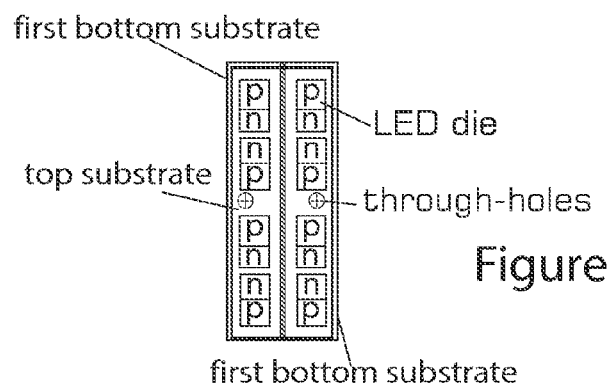
Figure 58:
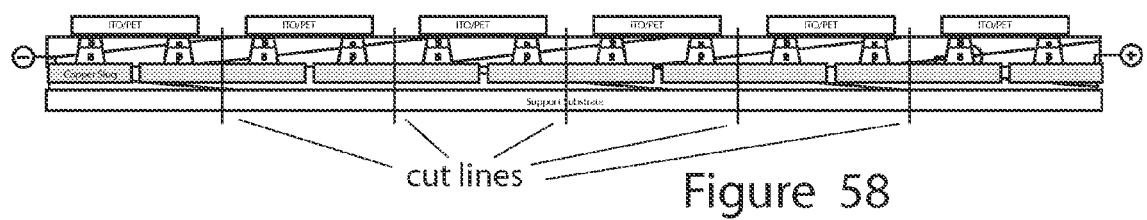
FIG. 58 shows multiple higher voltage light sheet devices formed as a single light sheet (or in a roll-to-roll process) and constructed so that each higher voltage device is connected in series with the other higher voltage devices on the sheet or roll resulting in successively higher operating voltages depending on the numbers of series connected devices.
Figure 59:
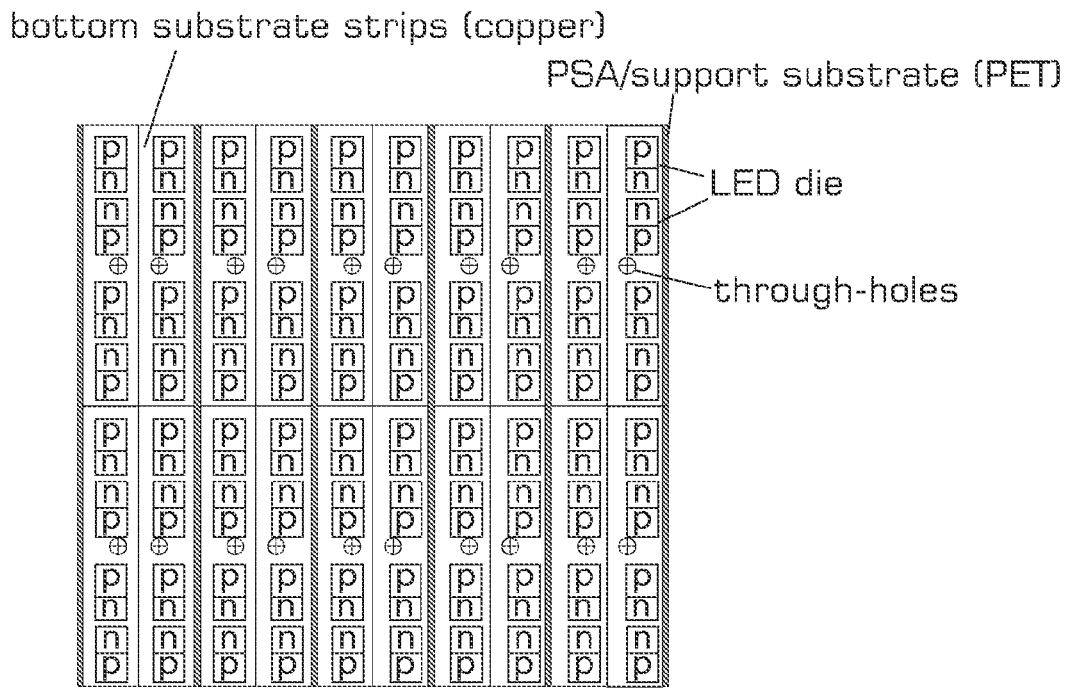
FIG. 59 is a top view of assembled elements of a light sheet constructed in accordance with the higher voltage light sheet construction shown in FIGS. 57 and 58.
Figure 60:
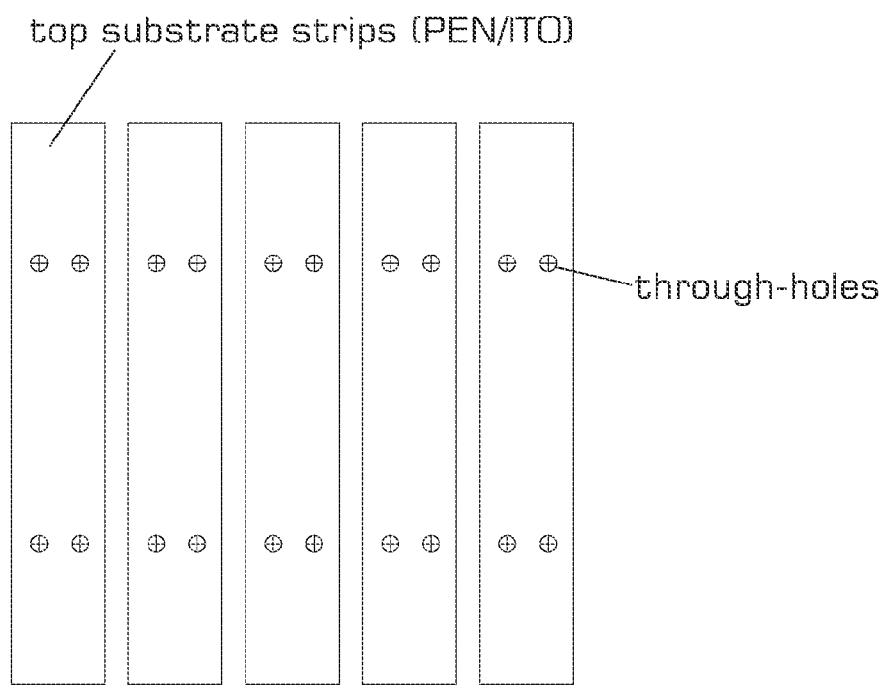
FIG. 60 is a top view of top transparent substrate strips for completing the light sheet construction shown in FIG. 59.

FIG. 57(b) is a top view of the higher voltage light sheet shown in FIG. 57(a) and cut from a multiple module light sheet constructed along the lines shown in FIGS. 58 through 60. A light emitting device includes a first bottom substrate having an electrically conductive surface. A second bottom substrate having an electrically conductive surface is provided adjacent to but electrically isolated from the first bottom substrate. A first bare die light emitting diode device having a top p junction conductor and a bottom n junction conductor is provided in electrical communication with the electrically conductive surface of the first bottom conductor. A second bare die light emitting diode device having a top n junction conductor and a bottom p junction conductor is provided in electrical communication with the electrically conductive surface of the second bottom conductor. The p/n junctions of the diodes may be reversed. A top substrate has a conductive surface in electrical communication with both the top p junction conductor of the first bare die light emitting diode device and the top n junction conductor of the second bare die light emitting diode device. The electrically conductive surface of the top substrate is effective for putting the first bare die light emitting diode device and the second bare die light emitting diode device into a series electrical connection.

The electrically conductive surface can be provided with a predetermined resistance value effective to create the equivalent of a ballast resistor within a desired resistance range in series with the first bare die light emitting diode device and the second bare die light emitting diode device. This equivalent ballast resistor enables the bare die light emitting diode devices to be driven at a desired current level for a given voltage applied to the first and the second bottom substrates. The equivalent ballast resistor can be adjusted, through the selection of materials or geometry, so that the first and the second bare die light emitting diode devices can be connected in series even if they do not have the same electrical characteristics.

Subsequent bottom substrates and top substrates can be provided so that multiple series devices are connected. Depending on the chosen materials, geometry and LED bare die chips, an AC driven variable intensity, variable color 110V (or 220V) source lighting device can be provided. Other voltages and wavelength emissions are also possible using this inventive construction.

To form higher voltage devices, a third bare die light emitting diode device having a top p junction conductor and a bottom n junction conductor is provided. The bottom n junction conductor is in electrical communication with the electrically conductive surface of the second bottom conductor. At least one subsequent bottom substrate is provided with a subsequent electrically conductive surface. Subsequent bare die light emitting diodes are provided in electrical communication with the subsequent electrically conductive surface. At least one subsequent top substrate having a subsequent top conductive surface in electrical communication with the third bare die light emitting diode and the subsequent bare die light emitting diodes so that the subsequent bare die light emitting diodes are connected in series. To make higher voltage devices, and/or for forming daughter modules that can be cut from a mother sheet, additional subsequent series connection substrates as needed are provided having a subsequent series connecting conductive surface in electrical communication with remaining subsequent bare die light emitting diode devices so that the subsequent bare die light emitting diodes on the at least one subsequent substrates are connected in series.

That is, to form higher voltage device, at least one subsequent bottom substrates having subsequent electrically conductive surfaces. Bare die light emitting diodes with opposite polarity are provided in electrical communication with the subsequent electrically conductive surfaces. At least one subsequent top substrate having a subsequent top conductive surface is in electrical communication with the subsequent bare die light emitting diodes so that the subsequent bare die light emitting diodes are connected in series. Thus, as more elements are added in series, the driving voltage of the light sheet increase. In accordance with the present invention, the light sheet can be constructed so that it emits light when connected with either polarity DC voltage. The opposite polarity bare die light emitting diode devices are in electrically connected with the electrically conductive surface and the top substrate and electrically conductive surface of the first and second bottom substrates. The opposite polarity bare die light emitting diode devices are electrically connected in respective opposite polarity to and along with the first bare die light emitting diode device and the second bare die light emitting diode device. This construction also enables the device to be driven so that it will emit light when driven with an AC voltage. The LED die are of opposite polarity within each series connected portion of the light sheet circuit, and connected such that they will be emitting light or blocking electron flow depending on the polarity of the AC voltage leg.

FIG. 58 shows multiple higher voltage light sheet devices formed as a single light sheet (or in a roll-to-roll process) and constructed so that each higher voltage device is connected in series with the other higher voltage devices on the sheet or roll resulting in successively higher operating voltages depending on the numbers of series connected devices. FIG. 59 is a top view of assembled elements of a light sheet constructed in accordance with the higher voltage light sheet construction shown in FIGS. 57 and 58. FIG. 60 is a top view of top transparent substrate strips for completing the light sheet construction shown in FIG. 59. By building up successive in-series devices, higher and higher source voltages can be accommodated. Also, by placing chips of opposite polarity on each copper strip, an AC circuit can be created. This construction also provides through holes that can be used during the manufacturing process for alignment of the components as well as to provide solder, crimp or clamp connection points directly on the copper strips. Thus, the more difficult electrical terminal connection to the thin flexible plastic substrate is avoided.

Figure 61:
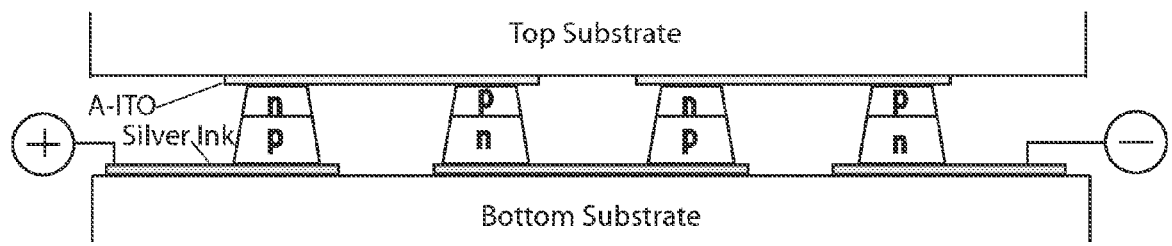
FIG. 61 is a cross sectional view of an alternative construction of a higher voltage light sheet.
Figure 62:
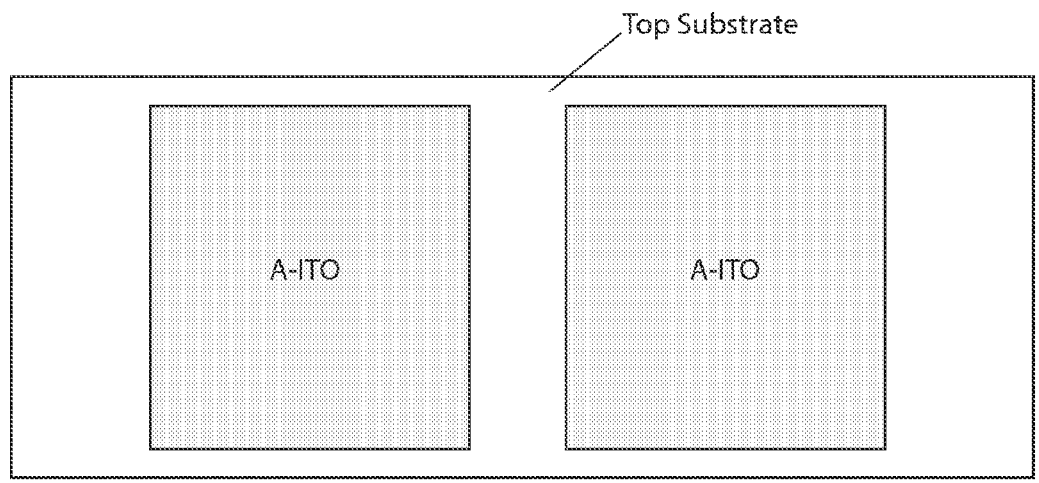
FIG. 62 is a top view of a top substrate for the alternative construction of a higher voltage light sheet shown in FIG. 61.
Figure 63:
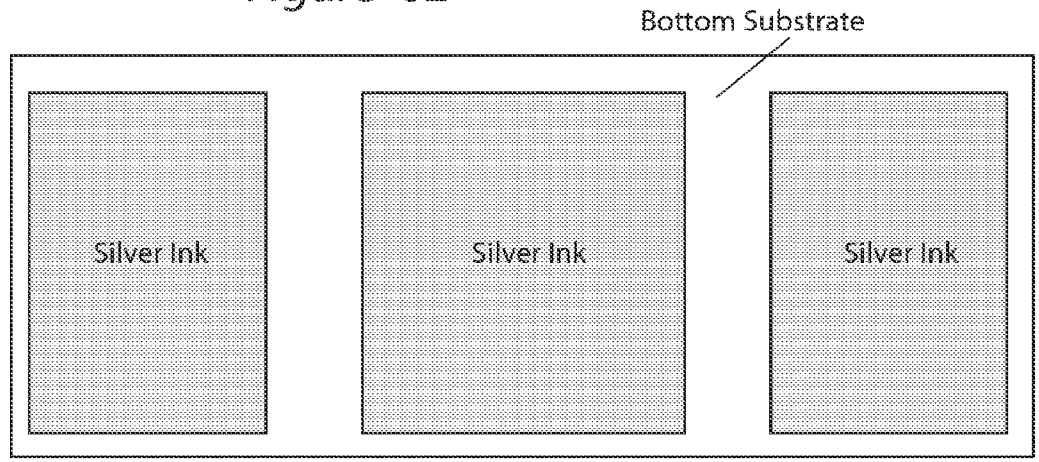
FIG. 63 is a top view of a bottom substrate for the alternative construction of a higher voltage light sheet shown in FIG. 61.

FIG. 61 is a cross sectional view of an alternative construction of a higher voltage light sheet. FIG. 62 is a top view of a top substrate for the alternative construction of a higher voltage light sheet shown in FIG. 61. FIG. 63 is a top view of a bottom substrate for the alternative construction of a higher voltage light sheet shown in FIG. 61.

Figure 66:
FIG. 66 is an alternate construction of the light sheet showing only the metal substrates connected to a coin cell battery.

FIG. 64 shows an exploded view of an inventive construction of the light sheet utilizing a coin cell battery with LED bare die having appropriate polarity fixed directly to the positive and negative sides of the battery. FIG. 65 shows an assembled view of the inventive construction of the light sheet shown in FIG. 64. FIG. 66 is an alternate construction of the light sheet showing only the metal substrates connected to a coin cell battery. In this case, a light sheet can be connected to the metal substrates or the metal substrates can be provided as at least one of the light sheet substrates. FIG. 67 shows a camouflaged housing for the inventive light sheet mimicking the color, size and texture of a rock.

Figure 68:
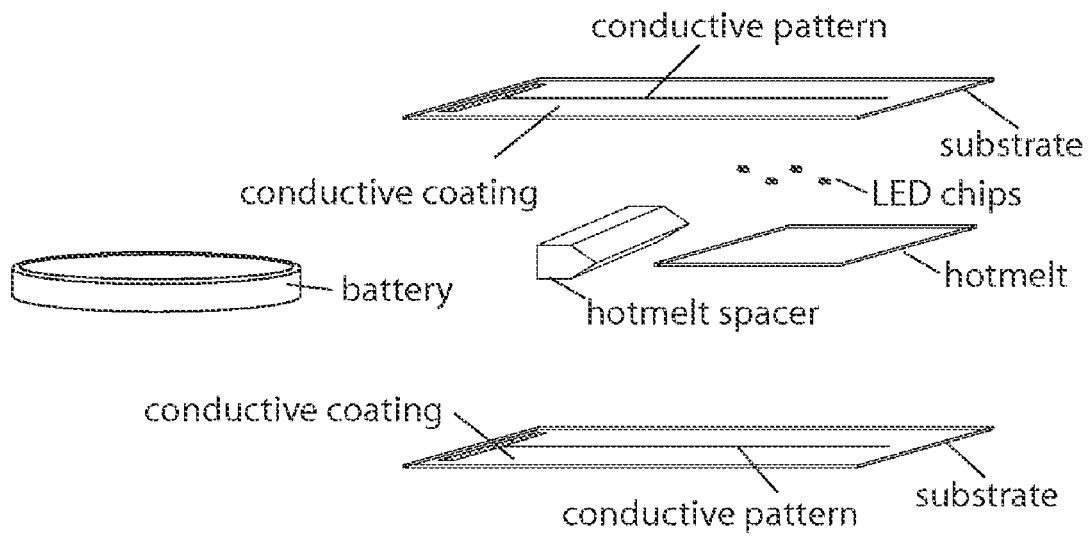
FIG. 68 shows an exploded view of an alternate construction of the light sheet showing a hot melt spacer for forming a battery pouch between the top and bottom substrates.
Figure 69:
FIG. 69 is a cross sectional assembled view of the light sheet construction shown in FIG. 68.
Figure 70:
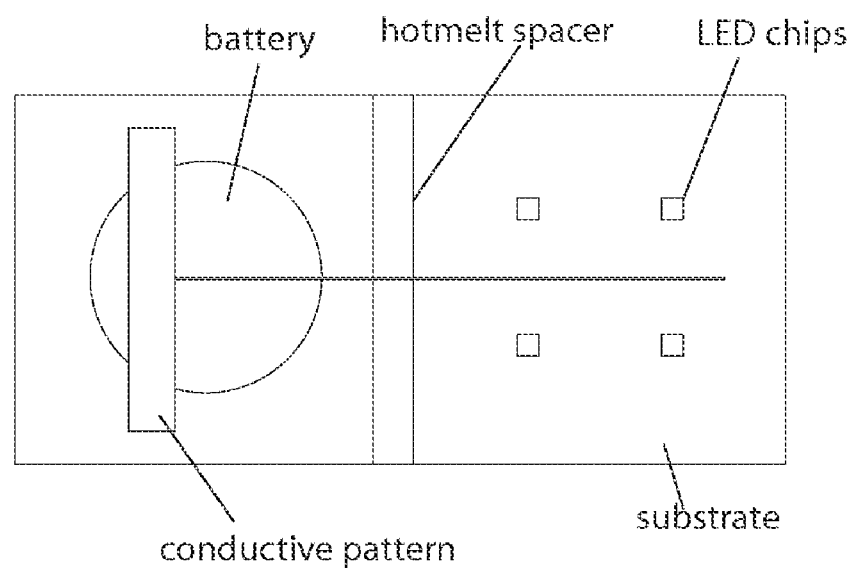
FIG. 70 is a top view of an alternative construction of the light sheet.

FIG. 68 shows an exploded view of an alternate construction of the light sheet showing a hot melt spacer for forming a battery pouch between the top and bottom substrates. FIG. 69 is a cross sectional assembled view of the light sheet construction shown in FIG. 68. FIG. 70 is a top view of an alternative construction of the light sheet. This construction enables a very low cost device to be manufactured without the conventionally required etched and drilled printed circuit board, soldered packaged LED lamps, diodes and resistors, battery connection schemes, etc.

Figure 71:
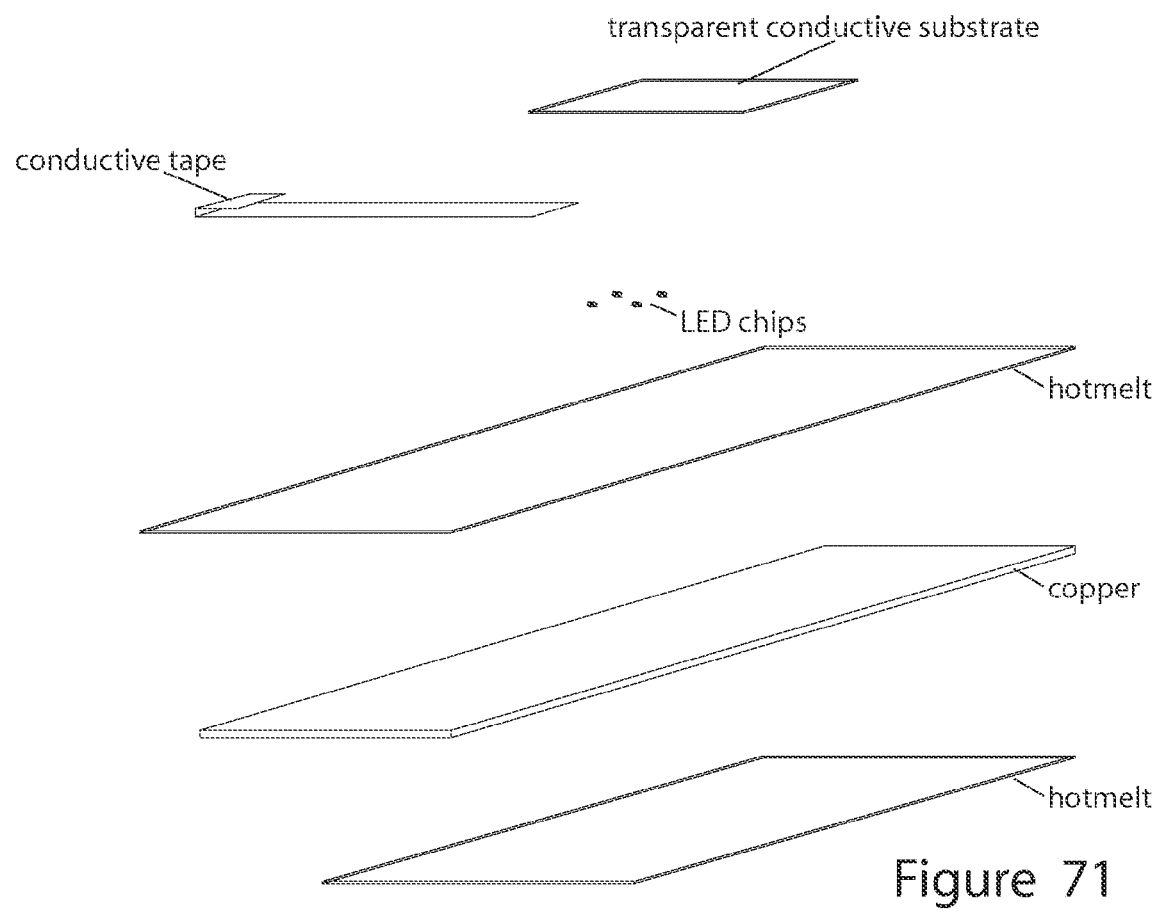
FIG. 71 is an exploded view of a coin battery light sheet construction on a metal substrate.
Figure 72:
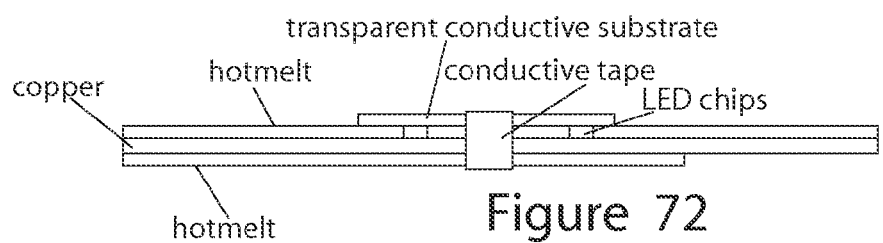
FIG. 72 is a cross sectional view of the alternative construction shown in FIG. 71.
Figure 73:
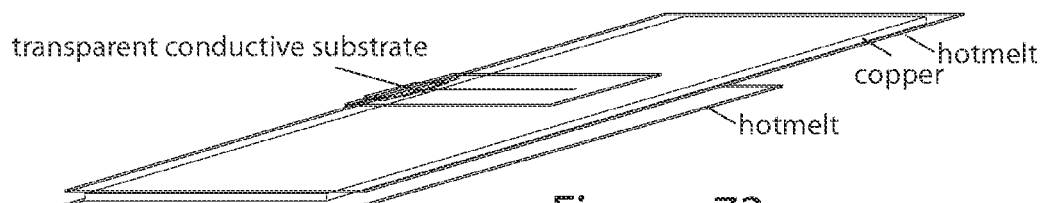
FIG. 73 is an assembled view of the coin battery light sheet construction shown in FIG. 71.
Figure 74:
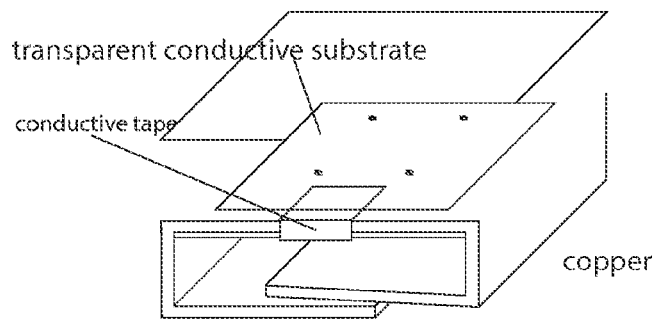
FIG. 74 is a view of the coin battery light sheet construction shown in FIG. 71 after forming.
Figure 75:
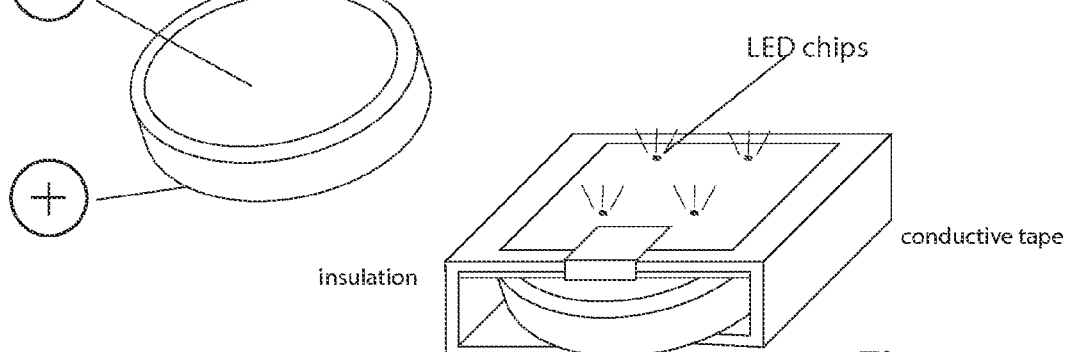
FIG. 75 is an assembled and formed view of the inventive coin battery light sheet construction shown in FIG. 71.

FIG. 71 is an exploded view of a coin battery light sheet construction on a metal substrate. FIG. 72 is a cross sectional view of the alternative construction shown in FIG. 71. FIG. 73 is an assembled view of the coin battery light sheet construction shown in FIG. 71. FIG. 74 is a view of the coin battery light sheet construction shown in FIG. 71 after forming. FIG. 75 is an assembled and formed view of the inventive coin battery light sheet construction shown in FIG. 71. This construction enables a completed light emitting device to be formed very inexpensively from just bare LED die, substrates, conductive tape, ink or foil, and adhesive. Because the device is formed with a metal substrate, it can be die-formed into a shape that accommodates and securely connects a coin battery. The result is a small, inexpensive light emitting device with a replaceable battery.

Figure 76:
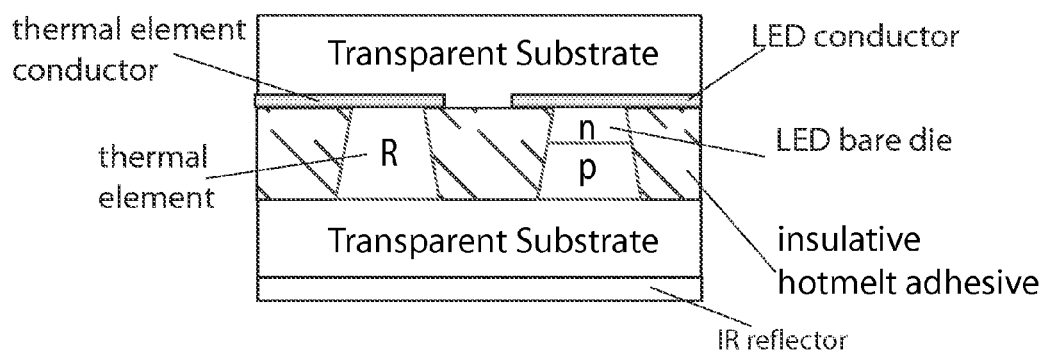
FIG. 76 is a cross sectional view of a multiple radiation emitter light sheet for emitting radiation of different wavelengths.
Figure 77:
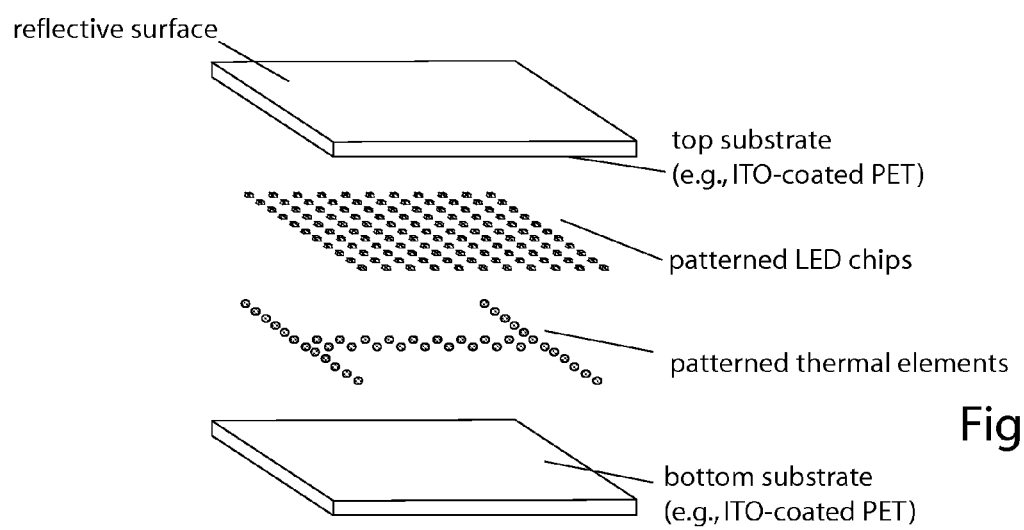
FIG. 77 is an exploded view of a light sheet construction having patterned LED bare die and patterned thermal energy emitters.

FIG. 76 is a cross sectional view of a multiple radiation emitter light sheet for emitting radiation of different wavelengths. FIG. 77 is an exploded view of a light sheet construction having patterned LED bare die and patterned thermal energy emitters. The multiple wavelengths emitted can be in the visible and invisible ranges. Also, a passive reflector can be provided to that the device can act as a passive and active signal emitter. The radiation emitters can be patterned for identification and to improve the radiation emissive quality.

Figure 78:
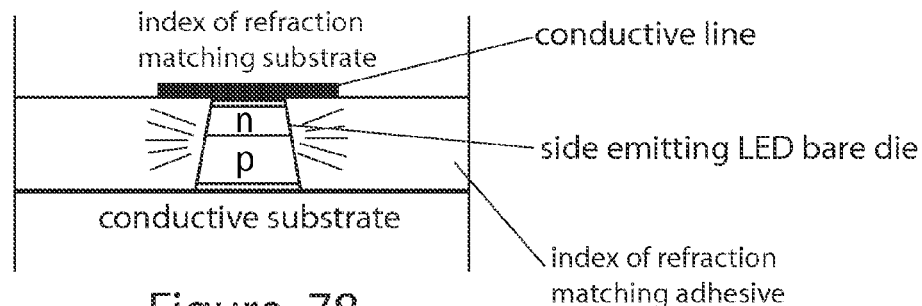
FIG. 78 is a cross sectional view of a light sheet construction having a conductive line for connecting with a side emitting LED bare die.

FIG. 78 is a cross sectional view of a light sheet construction having a conductive line for connecting with a side emitting LED bare die. Side emitting LED bare die are available the emit the majority of their light through the sides rather than through the top face of the die. These emitters can be used to provide a more uniform light from the light sheet when desired by reducing the hot spots of the bare die emitter. The adhesive and substrates can be selected to closely match the index of refraction of the LED die to further enhance light output. Also, additives can be provided within the adhesive to assist in light diffusion, wavelength conversion (e.g., phosphors for white light from blue or UV emission), selective blocking and light channeling, etc.

Figure 79:
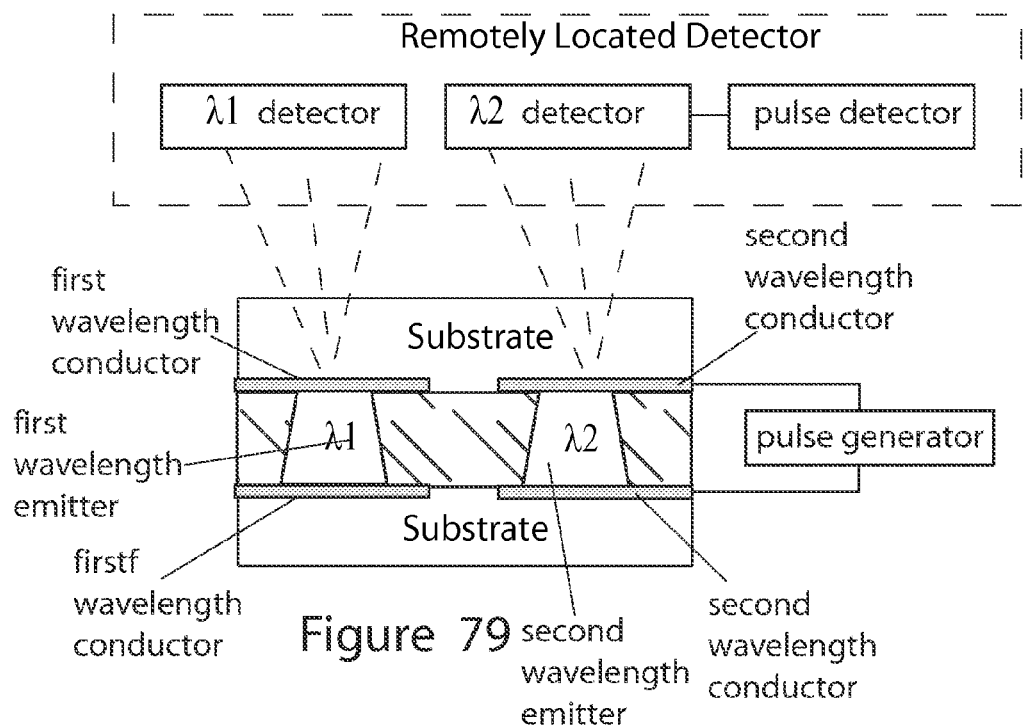
FIG. 79 is a side view and block diagram showing a construction of the light sheet including a first wavelength emitter and a second wavelength emitter, at least the second wavelength emitter being driven by a pulse generator, and a remotely located detector for detecting at least one of the first and second emitted wavelengths, as well as for detecting a pulse.

FIG. 79 is a side view and block diagram showing a construction of the light sheet including a first wavelength emitter and a second wavelength emitter, at least the second wavelength emitter being driven by a pulse generator, and a remotely located detector for detecting at least one of the first and second emitted wavelengths, as well as for detecting a pulse. For example, the first wavelength can be near-ir radiation and the second wavelength can be farther into the IR spectrum and pulsed to distinguish the wavelength emission from a warm body.

In accordance with this aspect of the invention, an active and passive radiation emitting device for identifying personnel, locations or goods includes a first substrate having a first conductive surface. A pattern of active radiation emitting semiconductor elements are in electrical communication with the conductive surface so that when the conductive surface is energized the radiation emitting semiconductor elements emit radiation of at least a first wavelength. A second substrate is provided and an adhesive encapsulates and adheres the bare radiation emitting semiconductor elements to the first substrate and securing the second substrate to the first substrate. At least one of a passive radiation reflecting surface and an active thermal radiation source are fixed to at least one the first substrate and the second substrate. The passive radiation reflecting surface reflects radiation from an external radiation source and the active thermal radiation source provides a detectable thermal or far IR emission.

Figure 80:
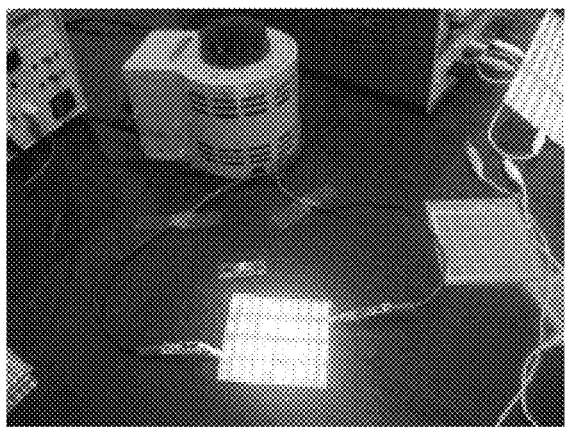
FIG. 80 is a photograph showing a higher voltage device being driven at about 50 volts AC and constructed along the lines of the light sheet constructions shown in FIGS. 57 to 63, two series connected devices being capable of connecting directly to a conventional 110VAC wall plug.

FIG. 80 is a photograph showing a higher voltage device being driven at about 50 volts AC and constructed along the lines of the light sheet constructions shown in FIGS. 57 to 63. Two series connected devices being capable of connecting directly to a conventional 110VAC wall plug. Alternative constructions of this device include a maximum efficiency device where there is little or no ballast resistor associated with the LED bare die (such as the side emitter construction shown in FIG. 78 and/or the transparent window construction shown in FIGS. 25 and 26). In this case, the device can enhanced by driving it using a limited current source to prevent damage to the LED die. By combining this construction with other constructions such as those using multiple emitting LED die with RGB, RGBY, BY and B(phosphor) patterns, a source lighting device can be provided that is variable in both color and intensity.

Figure 81:
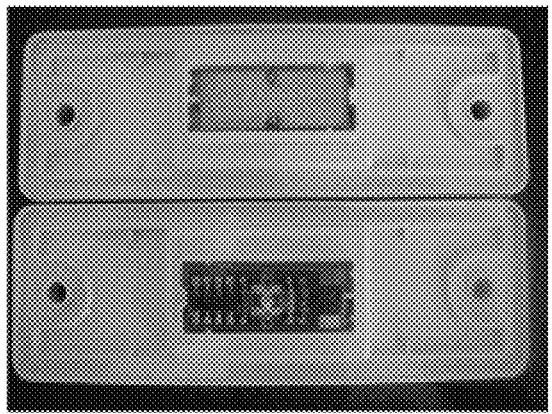
FIG. 81 is a photograph showing a higher voltage device cut from the device shown in FIG. 80 and constructed to be driven at 12 volts DC when connected in either polarity (top device) compared with a conventionally constructed printed circuit board having conventionally packaged LED lamp, resistors, and rectifying diodes soldered to a conventional PCB (bottom device)
Figure 82:
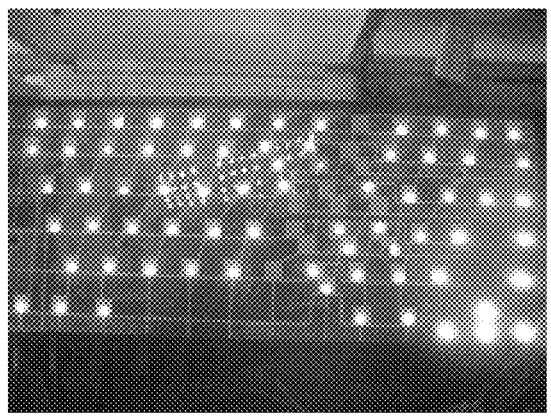
FIG. 82 is a photograph showing a notebook computer keyboard light constructed along the lines of FIGS. 18 to 20.
Figure 83:
FIG. 83 is a photograph showing the notebook computer keyboard light shown in FIG. 82 lighting up a notebook computer keyboard.
Figure 84:
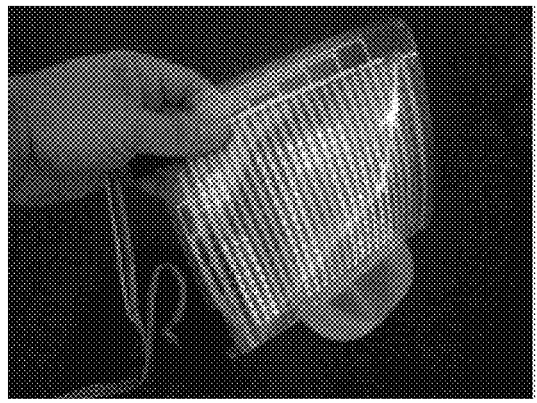
FIG. 84 shows a thin, lightweight, flexible pixilated scrolling message display constructed along the lines of FIG. 3.
Figure 85:
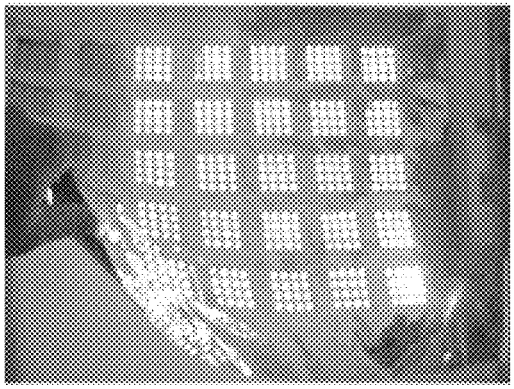
FIG. 85 is a photograph showing a large format, thin, lightweight, flexible display having assembled display tiles making up individual display pixels.
Figure 86:
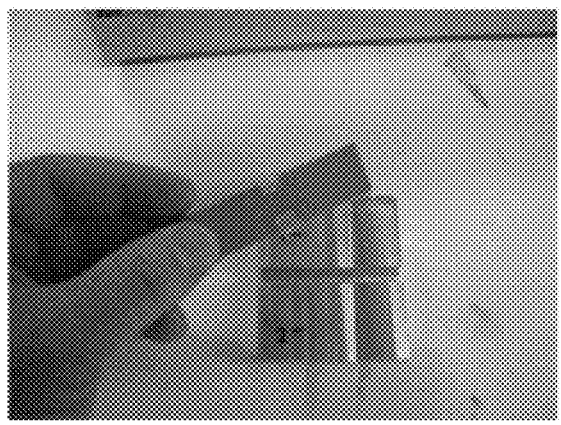
FIG. 86 is a photograph of a coin battery light sheet constructed along the lines shown in FIGS. 71 through 75 before being formed and showing the forming die.
Figure 87:
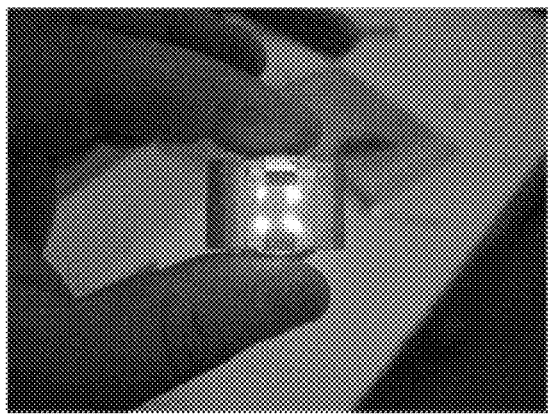
FIG. 87 is a photograph of the coin battery light sheet shown in FIG. 86 after being formed and with a coin battery inserted.
Figure 88:
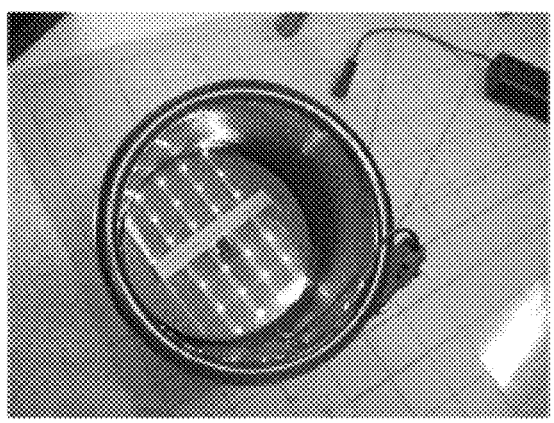
FIG. 88 shows a light sheet being used to light up a cup holder.
Figure 89:
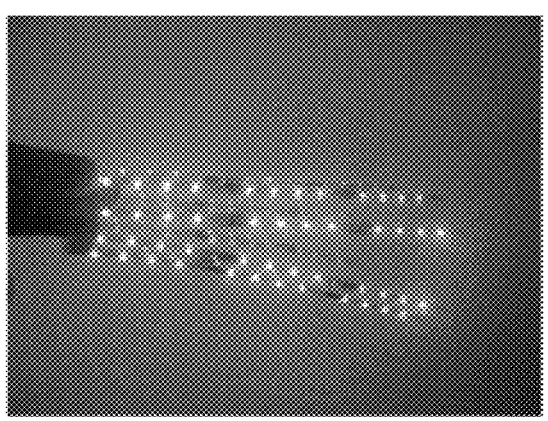
FIG. 89 shows a light sheet having multiple light sheet strips constructed along the lines shown in FIGS. 51-53 for being used as a fishing lure.
Figure 90:
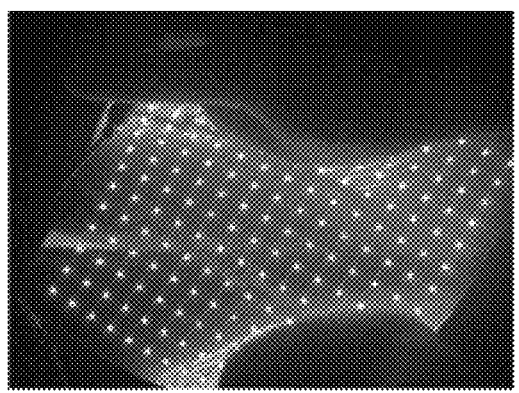
FIG. 90 shows a thin, flexible light sheet constructed on a half-hard copper back substrate and having a size of about 8 inches square.
Figure 91:
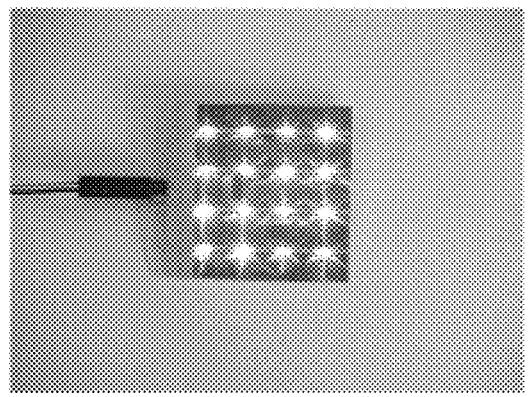
FIG. 91 shows an infrared light sheet for providing identification through the emission of a wavelength that is invisible to human vision.

FIG. 81 is a photograph showing a higher voltage device cut from the device shown in FIG. 80 and constructed to be driven at 12 volts DC when connected in either polarity (top device) compared with a conventionally constructed printed circuit board having conventionally packaged LED lamp, resistors, and rectifying diodes soldered to a conventional PCB (bottom device). FIG. 82 is a photograph showing a notebook computer keyboard light constructed along the lines of FIGS. 18 to 20. FIG. 83 is a photograph showing the notebook computer keyboard light shown in FIG. 82 lighting up a notebook computer keyboard. FIG. 84 shows a thin, lightweight, flexible pixilated scrolling message display constructed along the lines of FIG. 3. FIG. 85 is a photograph showing a large format, thin, lightweight, flexible display having assembled display tiles making up individual display pixels. FIG. 86 is a photograph of a coin battery light sheet constructed along the lines shown in FIGS. 71 through 75 before being formed and showing the forming die. FIG. 87 is a photograph of the coin battery light sheet shown in FIG. 86 after being formed and with a coin battery inserted. FIG. 88 shows a light sheet being used to light up a cup holder. FIG. 89 shows a light sheet having multiple light sheet strips constructed along the lines shown in FIGS. 51-53 for being used as a fishing lure. FIG. 90 shows a thin, flexible light sheet constructed on a half-hard copper back substrate and having a size of about 8 inches square. FIG. 91 shows an infra-red light sheet for providing identification through the emission of a wavelength that is invisible to human vision.

The various elements making up each embodiment of the inventive devices and the various steps performed in the inventive methods can be interchanged in a variety of iterations, not all of which are provided as specific embodiments or examples herein. For example, function-enhancing components, such as phosphors, described in one embodiment may be employed, although not specifically described, in an alternative construction of another embodiment. Such iterations are specifically included within the scope of the inventions described herein.

With respect to the above description, it is realized that the optimum dimensional relationships for parts of the invention, including variations in size, materials, shape, form, function, and manner of operation, assembly and use, are deemed readily apparent and obvious to one skilled in the art. All equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described. Accordingly, all suitable modifications and equivalents may be resorted to, falling within the scope of the invention.

What is claimed is:

1. A bare die semiconductor circuit, comprising:
    a first substrate having an electrically conductive surface;
    a second substrate having an electrically conductive surface;
    a first bare die semiconductor circuit element having a first conductor and a second conductor, the second conductor of the first bare die semiconductor circuit element in electrical communication with the electrically conductive surface of the first substrate;
    a second bare die semiconductor circuit element having a first conductor and a second conductor, the second conductor of the second bare die semiconductor circuit element in electrical communication with the electrically conductive surface of the second substrate; and
    a series connecting substrate having a conductive surface, said conductive surface of the series connecting substrate in electrical communication with both the first conductor of the first bare die semiconductor circuit element and the first conductor of the second bare die semiconductor circuit element, the electrically conductive surface of the series connecting substrate being effective for putting the first bare die semiconductor circuit element and the second bare die semiconductor circuit element into a series electrical connection.

2. A bare die semiconductor circuit according to claim 1 wherein the electrically conductive surface of at least the first substrate, the second substrate and the series connecting substrate has a predetermined resistance value effective to create a ballast resistor in series with the first bare die semiconductor circuit element and the second bare semiconductor circuit element.

3. A bare die semiconductor circuit according to claim 1 further comprising:
    at least one subsequent bottom substrate having subsequent electrically conductive surface;
    subsequent bare die semiconductor circuit elements in electrical communication with said subsequent electrically conductive surface; and
    at least one subsequent top substrate having a subsequent top conductive surface in electrical communication with the subsequent bare die semiconductor circuit elements so that the subsequent bare die semiconductor circuit elements are connected in series with the first bare die semiconductor circuit element and the second bare die semiconductor circuit element.

4. A bare die semiconductor circuit according to claim 1 further comprising opposite polarity bare die semiconductor circuit elements electrically connected in respective opposite polarity to and along with the first bare die semiconductor circuit element and the second bare die semiconductor circuit element to form an electronic circuit that conducts in both polarity directions.

5. A bare die semiconductor circuit according to claim 1 further comprising an adhesive adhering the series connecting substrate to the first substrate and to the second substrate, the adhesive adhering the first bare die semiconductor circuit element to the first substrate and to the series connecting substrate while maintaining the electrical communication between the second conductor of the first bare die semiconductor circuit element to the conductive surface of the first substrate and maintaining the electrical communication between the first conductor of the first bare die semiconductor circuit element to the conductive surface of the series connecting substrate, the adhesive adhering the second bare die semiconductor circuit element to the second substrate and to the series connecting substrate while maintaining the electrical communication between the second conductor of the second bare die semiconductor circuit element to the conductive surface of the second substrate and maintaining the electrical communication between the first conductor of the second bare die semiconductor circuit element to the conductive surface of the series connecting substrate.

6. A light emitting device according to claim 5 wherein the adhesive comprises at least one of a thermally active adhesive, a catalyst active adhesive, a solvent evaporation active adhesive and a radiation active adhesive.

7. A light emitting device according to claim 5 wherein the first and the second bare die semiconductor circuit elements are at least partially embedded in the adhesive with a respective top conductive side and bottom conductive side left at least partially uncovered by the adhesive so that the adhesive binds the first substrate and the second substrate to the series connecting substrate with the first and the second bare die semiconductor circuit elements in electrical communication with the respective conductive surfaces.

8. A bare die semiconductor circuit, comprising:
    a first substrate having an electrically conductive surface;
    a second substrate having an electrically conductive surface;
    a first bare die semiconductor circuit element having a first conductor and a second conductor, the second conductor of the first bare die semiconductor circuit element in electrical communication with the electrically conductive surface of the first substrate;
    a second bare die semiconductor circuit element having a first conductor and a second conductor, the second conductor of the second bare die semiconductor circuit element in electrical communication with the electrically conductive surface of the second substrate;
    a series connecting substrate having a conductive surface, said conductive surface of the series connecting substrate in electrical communication with both the first conductor of the first bare die semiconductor circuit element and the first conductor of the second bare die semiconductor circuit element, the electrically conductive surface of the series connecting substrate being effective for putting the first bare die semiconductor circuit element and the second bare die semiconductor circuit element into a series electrical connection;
    at least one subsequent bottom substrate having subsequent electrically conductive surface;
    subsequent bare die semiconductor circuit elements in electrical communication with said subsequent electrically conductive surface; and at least one subsequent top substrate having a subsequent top conductive surface in electrical communication with the subsequent bare die semiconductor circuit elements so that the subsequent bare die semiconductor circuit elements are connected in series with the first bare die semiconductor circuit element and the second bare die semiconductor circuit element.

* * * * *